United States Patent [19]

Takase

[11] Patent Number: 5,563,539
[45] Date of Patent: Oct. 8, 1996

[54] OUTPUT BUFFER CIRCUIT CHANGEABLE OF THE OUTPUT SIGNAL FROM A LOW TO A HIGH IMPEDANCE STATE

[75] Inventor: Hiroshi Takase, Kasugai, Japan

[73] Assignees: Fujitsu Limited, Kawasaki; Fujitsu VLSI Limited, Kasugai, both of Japan

[21] Appl. No.: 202,470

[22] Filed: Feb. 28, 1994

[30] Foreign Application Priority Data

Apr. 28, 1993 [JP] Japan .................................. 5-102563

[51] Int. Cl.$^6$ ...................... H03K 19/017; H03K 19/094
[52] U.S. Cl. ............................ 327/185; 327/374; 326/57
[58] Field of Search ................................. 326/58, 57, 56,
326/27, 17; 327/185, 384, 387, 388, 389, 391, 112, 214, 225, 230, 374, 376, 377

[56] References Cited

U.S. PATENT DOCUMENTS

| | | | |
|---|---|---|---|
| 4,217,502 | 8/1980 | Suzuki et al. | 326/58 |
| 4,449,064 | 5/1984 | Eckert et al. | 326/57 |
| 4,486,674 | 12/1984 | Neely | 326/56 |
| 4,529,895 | 7/1985 | Garverick et al. | 326/56 |
| 4,818,901 | 4/1989 | Young et al. | 326/27 |
| 4,839,540 | 6/1989 | Ueno | 326/56 |
| 4,906,867 | 3/1990 | Petty | 326/27 |
| 5,083,048 | 1/1992 | Kashimura | 326/56 |
| 5,319,260 | 6/1994 | Wanlass | 326/26 |
| 5,440,182 | 8/1995 | Dobbelaere | 326/38 |

Primary Examiner—Timothy P. Callahan
Assistant Examiner—Terry L. Englund
Attorney, Agent, or Firm—Nikaido, Marmelstein, Murray & Oram LLP

[57] ABSTRACT

An output buffer circuit includes a pull-down side transistor connected between an output terminal and a low-potential power source. The pull-down side transistor is driven by an input signal, such that when the pull-down side transistor is turned on by the input signal, a low level output signal is output from the output terminal. A pull-up circuit is connected between the output terminal and a high-potential power source, for changing the output signal to a high level in accordance with the input signal when the transistor is turned off in response to the input signal. The pull-up circuit ceases to function when the output signal goes high thereby creating a high impedance condition. The pull-up circuit includes an OR gate which receives the input signal and the output signal, and an inverter which receives an output signal of the OR gate. A differentiating circuit is provided, through which an output signal of the inverter circuit is output to the output terminal.

24 Claims, 16 Drawing Sheets

OUTPUT BUFFER CIRCUIT CHANGEABLE OF THE OUTPUT SIGNAL FROM A LOW TO A HIGH IMPEDANCE STATE

BACKGROUND OF THE INVENTION

1. Field of the Invention

The present invention relates to an output buffer circuit for outputting digital signals.

2. Description of the Related Art

In the present market for semiconductor integrated circuits, the consuming public has increasingly demanded circuits having faster operational speeds with lower power requirements. This demand is mirrored by a similar demand placed on the design of widely used semiconductor component circuits. One such component circuit is the output buffer circuit.

FIG. 1 shows one example of a conventional output buffer circuit. An N channel MOS transistor Tr1 has a drain connected to an output terminal "To" and a source connected to a ground GND. An input signal IN is input to the gate of the transistor Tr1 from a logic control circuit 1. In such an open-drain type output buffer circuit, the transistor Tr1 is turned on and outputs an L-level output signal OUT from the output terminal "To" when the input signal IN goes high. Transistor Tr1 turns off to render the output signal OUT to a high impedance state when the input signal IN goes low. Connected to the output terminal "To" is a load circuit 2a operating according to whether the output signal OUT is at a L level or at a high impedance state.

The load circuit 2a has a high-resistance resistor R whose first end is connected to the output terminal "To" with a power source Vcc connected to its second end. When the transistor Tr1 is turned on, a drain current flows via the resistor R to the transistor Tr1 from the power source Vcc. As a result, the output signal OUT goes low based on a voltage drop caused by the resistor R. When the transistor Tr1 is turned off, a drain current to the transistor Tr1 from the power source Vcc stops. As a result, the output signal OUT from the load circuit has a high impedance. As a result, current is supplied via the resistor R to the output terminal "To" from the power source Vcc, setting the potential of the output terminal "To" to an H level.

In this output buffer circuit, a rise in the potential of the output signal OUT when the transistor Tr1 switches off depends on the resistance of the resistor R. When the resistance of the resistor R is large, the rate of change in the rising speed of the output signal OUT decreases. When the resistance of resistor R is small, and when rate of change in the rising speed of output signal OUT increases, the drain current of the transistor Tr1 increases. This causes an increase in the power consumed by the circuit when an L-level output signal OUT is output.

To overcome such a shortcoming, a tri-state type output buffer circuit as shown in FIG. 2 has been proposed. This output buffer circuit comprises an N channel MOS transistor Tr2 as a pull-up side transistor, and an N channel MOS transistor Tr3 as a pull-down side transistor. The drain of the transistor Tr2 is connected to a high-potential power source Vcc, the source of the transistor Tr2 is connected to an output terminal "To", as well as the drain of the transistor Tr3. The source of Tr3 is connected to the ground GND as a low-potential power source. Input signals IN1 and IN2 are input respectively to the gates of the transistors Tr2 and Tr3 from a logic control circuit 1. In this output buffer circuit, when the input signal IN1 goes low and the input signal IN2 goes high, the transistor Tr2 is turned off and the transistor Tr3 is turned on, setting the output signal OUT to an L level. When the input signal IN1 goes high and the input signal IN2 goes low, the transistor Tr2 is turned on and the transistor Tr3 is turned off. This in effect sets the output signal OUT to an H level. When both input signals IN1 and IN2 go low, the transistors Tr2 and Tr3 are both turned off, setting the output signal OUT in a high impedance state.

Connected to the output terminal "To" of this output buffer circuit is a load circuit 2b which functions based on whether the output signal OUT is an L level, an H level or in a high impedance state. The load circuit 2b has terminal resistors Ru and Rd whose first ends are connected to the output terminal "To". The second end of the resistor Ru is connected to a power source Vcc and the second end of the resistor Rd connected to the ground GND. When the transistor Tr3 is turned off and the transistor Tr2 is turned on, the drain current of transistor Tr2 flows via the resistor Rd to the ground GND. As a result, the output signal OUT goes high based on a voltage drop caused by the resistor Rd. When the transistor Tr2 is turned off and the transistor Tr3 is turned on, the drain current flows into the transistor Tr3 via the resistor Ru from the power source Vcc. As a result, the output signal OUT goes low based on a voltage drop caused by the resistor Ru. When the transistors Tr2 and Tr3 are turned off, the output signal OUT is output at high impedance, so that the potential of the output terminal "To" is obtained by dividing the potential difference between the power source Vcc and the ground GND by the resistors Ru and Rd. Since the transistor Tr2 is turned on at the time when output signal OUT rises from a L level, the level of the output signal OUT can be pulled up to the H level from the L level quickly without reducing the resistance of the resistor Ru. If the transistors Tr2 and Tr3 are turned off after the potential of the output signal OUT is pulled up, the output signal OUT goes to a high impedance state so that the potential at the output terminal "To" promptly converges to a predetermined potential set by the resistors Ru and Rd. Further, because there is no need to decrease the resistance of the resistor Ru, the drain current of the transistor Tr3 is prevented from increasing when the L-level output signal OUT is output, thus preventing an increase in consumed power.

However, when output signal OUT is switched from an L to an H level in the output buffer circuit as shown in FIG. 2, the transistor Tr2 remains turned on. Consequently, the drain current of the transistor Tr2 flows to the ground GND via the resistor Rd of the load circuit 2b. This causes an increase in the power consumed by the circuit. When the output terminal "To" is coupled to the ground GND via the load circuit 2b with the transistor Tr2 turned on, current flows to the ground GND via the transistor Tr2 from the power source Vcc. This causes a further increase in the power consumed by the circuit.

SUMMARY OF THE INVENTION

It is therefore an objective of the present invention to provide an output buffer circuit which improves the circuit's operation speed from a time when the output signal changes from a low to a high impedance state to a time when the potential of the output signal converges to a predetermined level.

It is a further objective of the present invention to provide an output buffer circuit that has an increased operational speed which also consumes less power than the conventional circuits of conventional design.

To achieve this objective, according to this invention, a pull-down side transistor is connected between an output terminal and a low-potential power source. Based on an input signal, the pull-down side transistor is turned on, causing an L-level output signal to be output from the output terminal. When the pull-down transistor is turned off by the input signal, the output signal is output at a high impedance state. A pull-up circuit is connected to the output terminal. When the transistor is turned off based on the input signal, the pull-up circuit functions based on the input signal to pull up the output signal to an H level. When the output signal goes high, the pull-up circuit stops functioning.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

First Embodiment

Figure 3:
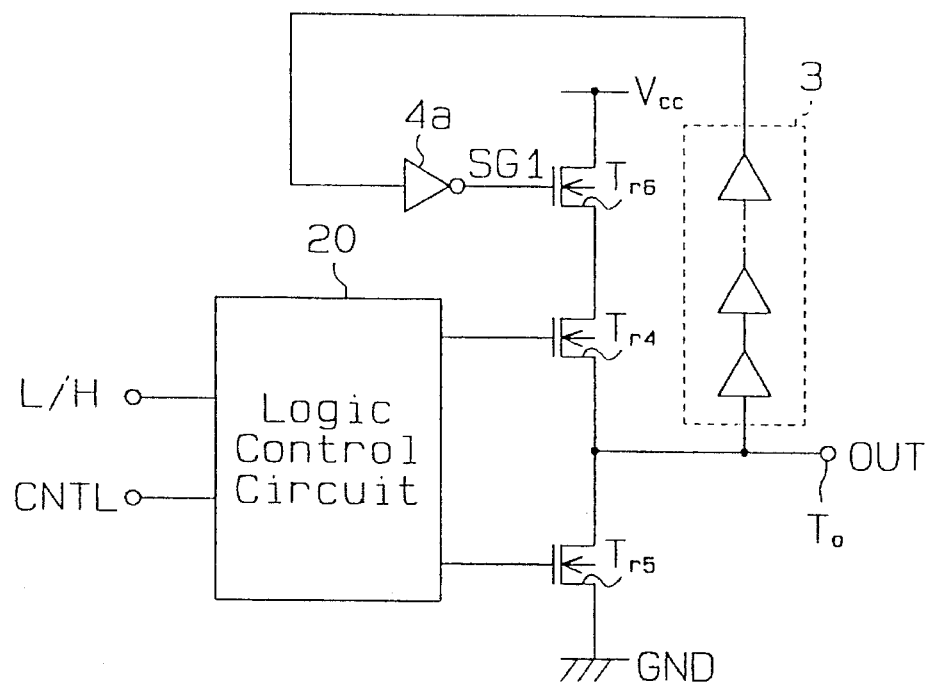
FIG. 3 is a circuit diagram showing a first embodiment according to the present invention.
Figure 4:
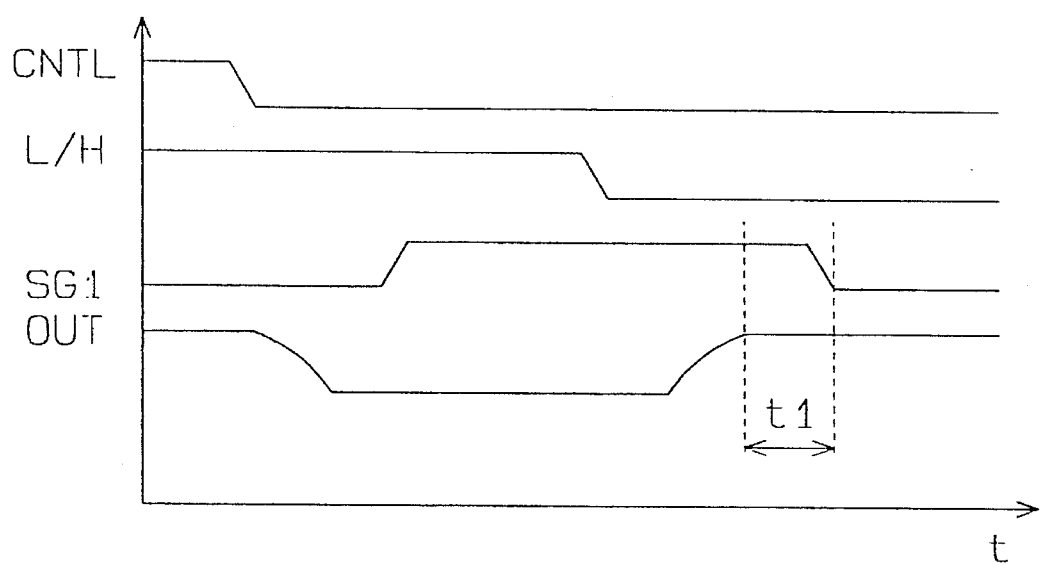
FIG. 4 is a waveform diagram illustrating the operation of the first embodiment.

FIGS. 3 and 4 illustrate an output buffer circuit according to a first embodiment of the present invention. As shown in FIG. 3, an input signal L/H and a control signal CNTL are input to a logic control circuit 20. Based on the input signal L/H and control signal CNTL, the logic control circuit 20 drives a pull-up side N channel MOS transistor Tr4 and a pull-down side N channel MOS transistor Tr5. The transistors Tr4 and Tr5 have their gates connected to the logic control circuit 20, with the source of the transistor Tr4 connected to an output terminal "To" and the drain of the transistor Tr5, whose source is connected to a ground GND. The drain of the transistor Tr4 is connected to the source of an N channel MOS transistor Tr6 and the drain of Tr6 is connected to a power source Vcc. An output signal OUT, which is to be output from the output terminal "To", is input to the gate of the transistor Tr6 via a delay circuit 3 having plural stages of buffer circuits and an inverter 4a.

Figure 1:
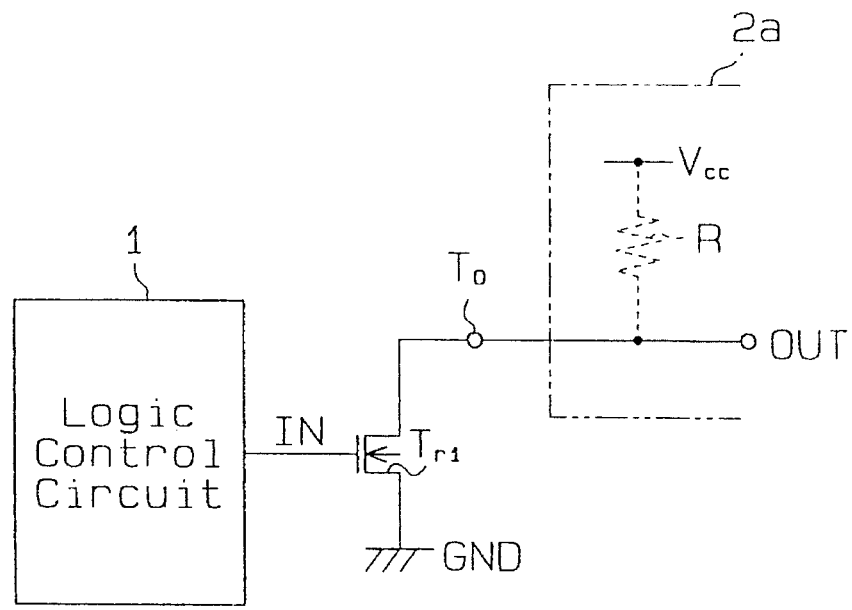
FIG. 1 is a circuit diagram showing a conventional output buffer circuit.
Figure 2:
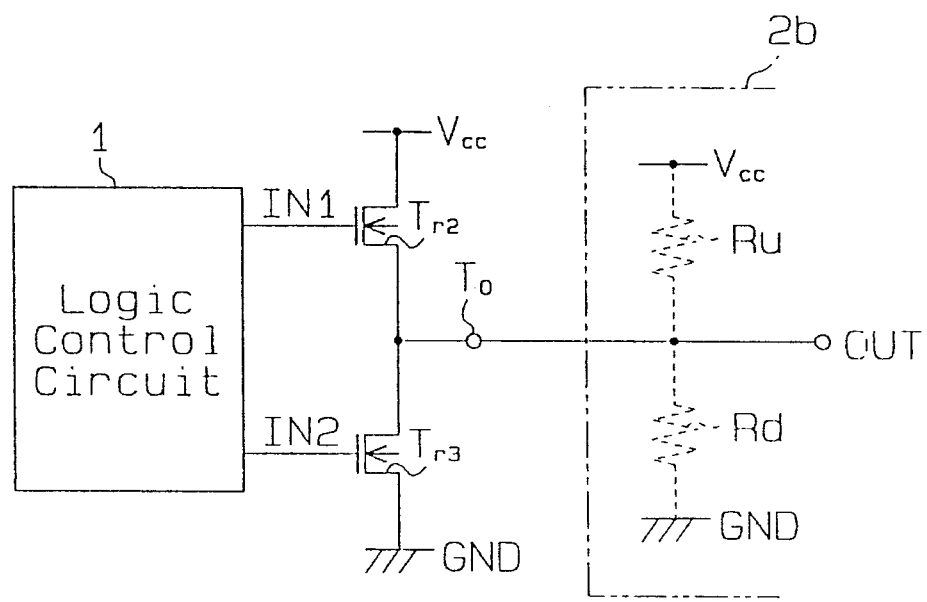
FIG. 2 is a circuit diagram showing another conventional output buffer circuit.

When the input signal L/H and control signal CNTL are both high, the logic control circuit 20 outputs an L-level signal to the gates of the transistors Tr4 and Tr5. If the input signal L/H is high when the control signal CNTL goes low, the logic control circuit 20 outputs an L-level signal to the gate of the transistor Tr4 and outputs an H-level signal to the gate of the transistor Tr5. When the input signal L/H and the control signal CNTL both go low, the logic control circuit 20 outputs an H-level signal to the gate of the transistor Tr4 and outputs an L-level signal to the gate of the transistor Tr5. A load circuit 2b shown in FIG. 2 is connected to the output terminal "To", which is connected via a terminal resistor Ru to a power source Vcc and to the ground GND via a terminal resistor Rd.

The operation of this output buffer circuit will be described with reference to FIG. 4. With the input signal L/H and control signal CNTL both at an H level, the logic control circuit 20 causes transistors Tr4 and Tr5 to turn off, which in turn causes the output signal OUT to go to a high impedance state. When the control signal CNTL goes low, the transistor Tr5 turns on, transistor Tr4 is clamped off, and the output signal OUT goes low. As a result, the output signal SG1 of the inverter 4a rises to an H level with a delay provided by the delay circuit 3, turning on the transistor Tr6. Under this condition, power from the power source Vcc is supplied to the transistor Tr4. When the input signal L/H goes low then, the logic control circuit 20 turns the transistor Tr4 on and turns the transistor Tr5 off. This quickly pulls the output signal OUT high. Then, the output signal SG1 of the inverter 4a falls low, after a time delay produced by the delay circuit 3, which causes the transistor Tr6 to turn off. Consequently, the supply of the power from the power source Vcc to the transistor Tr4 is stopped, setting the output signal OUT to a high impedance state.

As described above, at the time the output signal OUT is shifted to a high impedance state from a L level in this output buffer circuit, the output signal OUT is promptly pulled high from a L level. After the output signal OUT is pulled up, the supply of the power from the power source Vcc to the transistor Tr4 is stopped, setting the impedance of output signal OUT high so that its voltage level depends on the terminal resistance of the load circuit. Under this condition, even when the output terminal "To" becomes short-circuited to the ground GND via the load circuit, a large current will not flow to the ground GND from the power source Vcc since the supply of the power from the power source Vcc to the transistor Tr4 is blocked. In this output buffer circuit, therefore, given a shift in the impedance of the output signal OUT, i.e., after signal OUT changes from a low to a high state, the operational speed of the circuit increases and power consumption decreases.

Second Embodiment

Figure 5:
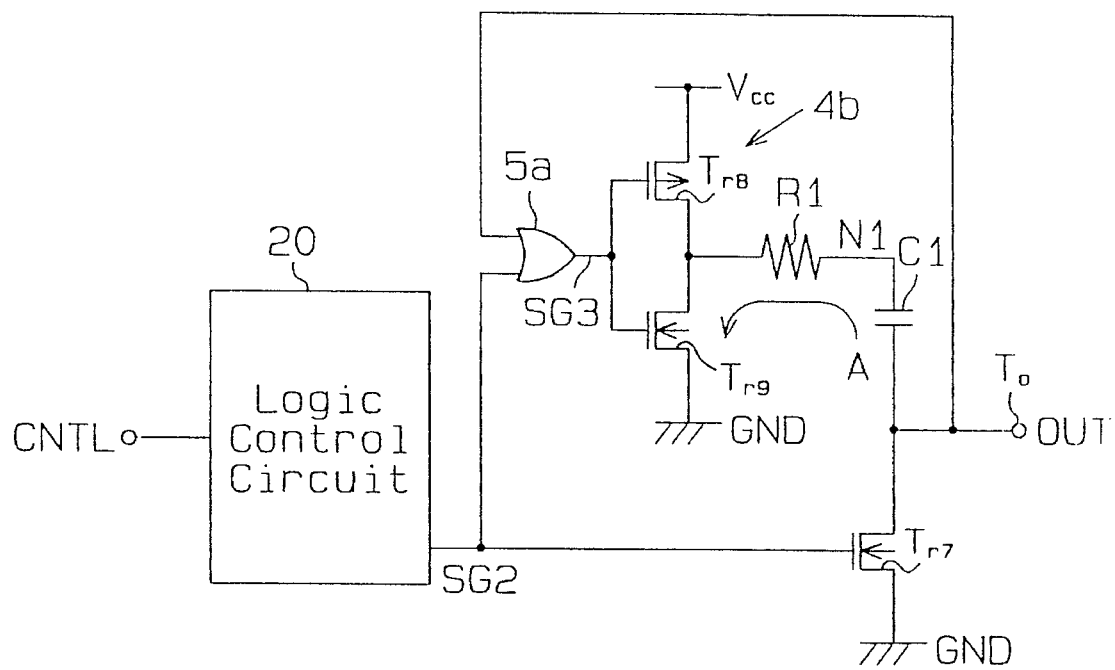
FIG. 5 is a circuit diagram showing a second embodiment.
Figure 6:
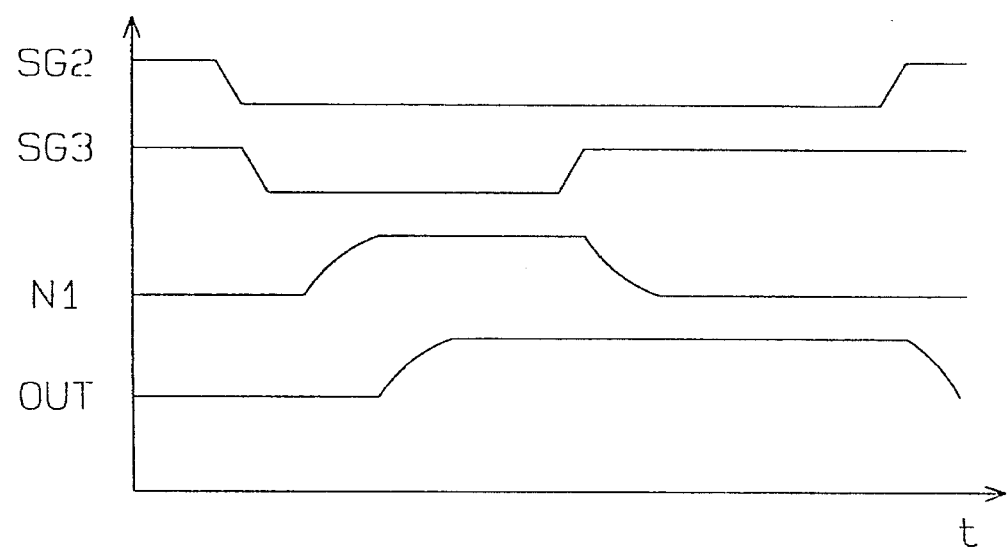
FIG. 6 is a waveform diagram illustrating the operation of the second embodiment.

FIGS. 5 and 6 illustrate an output buffer circuit according to a second embodiment of the present invention. As shown in FIG. 5, the control signal CNTL is input to the logic control circuit 20. Based on the control signal CNTL, the logic control circuit 20 drives a pull-down side N channel MOS transistor Tr7. The transistor Tr7 has its gate supplied with an output signal SG2 from the logic control circuit 20, with the source of the transistor Tr7 connected to the ground GND and its drain connected to the output terminal "To". The output signal SG2 is input to the first input terminal of an OR gate 5a, and the output signal OUT, which is to be output from the output terminal "To", is input to the second input terminal of the OR gate 5a. An output signal SG3 from the OR gate 5a is input to an inverter 4b, which comprises a P channel MOS transistor Tr8 and an N channel MOS transistor Tr9. The output signal of the inverter 4b is connected to the output terminal "To" via a differentiating circuit, which comprises a resistor R1 and a capacitor C1. The load circuit 2b shown in FIG. 2 is connected to the output terminal "To".

The operation of the thus constituted output buffer circuit will be described with reference to FIG. 6. When the output signal SG2 of the logic control circuit 20 goes high based on the control signal CNTL, the transistor Tr7 is turned on and the output signal OUT goes low. Under this situation, the output signal SG3 of the OR gate 5a goes high, turning on the transistor Tr9 of the inverter 4b. Then, a current flows in the direction of the arrow A shown in FIG. 5, so that the charges accumulated in the capacitor C1 are drawn to the ground GND via the resistor R1 and transistor Tr9, causing a node N1 to become the ground GND level.

Following this, when the output signal SG2 of the logic control circuit 20 goes low, the transistor Tr7 is turned off. The output signal SG3 of the OR gate 5a goes low in accordance with the L-level output signal OUT and the L-level gate signal SG2. This turns off the transistor Tr9 of the inverter 4b and turns on the transistor Tr8. Then, the drain current of the transistor Tr8 flows to the output terminal "To" via the resistor R1 and capacitor C1, raising the potential at the node N1 and the output signal OUT in accordance with a time constant based on the resistor R1 and capacitor C1. When the output signal OUT goes high, the output signal SG3 of the OR gate 5a goes high, alternatingly turning the transistors Tr8 and Tr9 of the inverter 4b off and on. Then, the charges in the capacitor C1 are drawn to the ground GND via the resistor R1 and transistor Tr9, so that the potential at the node N1 drops to the level of the ground GND. Under this condition, the impedance of output signal OUT goes high, and the supply of the current to the output terminal "To" via the transistor Tr8, resistor R1 and capacitor C1 from the power source Vcc is stopped.

In this output buffer circuit, therefore, in shifting the level of the output signal OUT to the high impedance state from the L level, the potential of the output signal OUT is promptly pulled up by the differentiating circuit, accounting for the increase in operational speed of the output buffer circuit. Further, after the potential of the output signal OUT is pulled up, the current supply to the output terminal "To" is inhibited, thus reducing the amount of power consumed.

Third Embodiment

Figure 7:
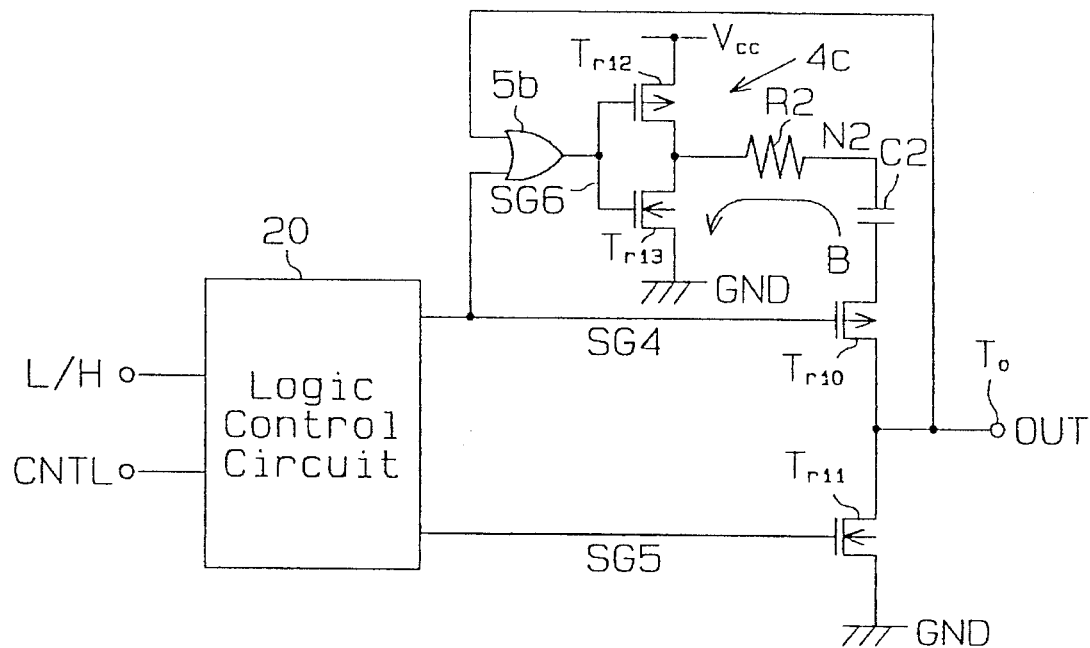
FIG. 7 is a circuit diagram showing a third embodiment.
Figure 8:
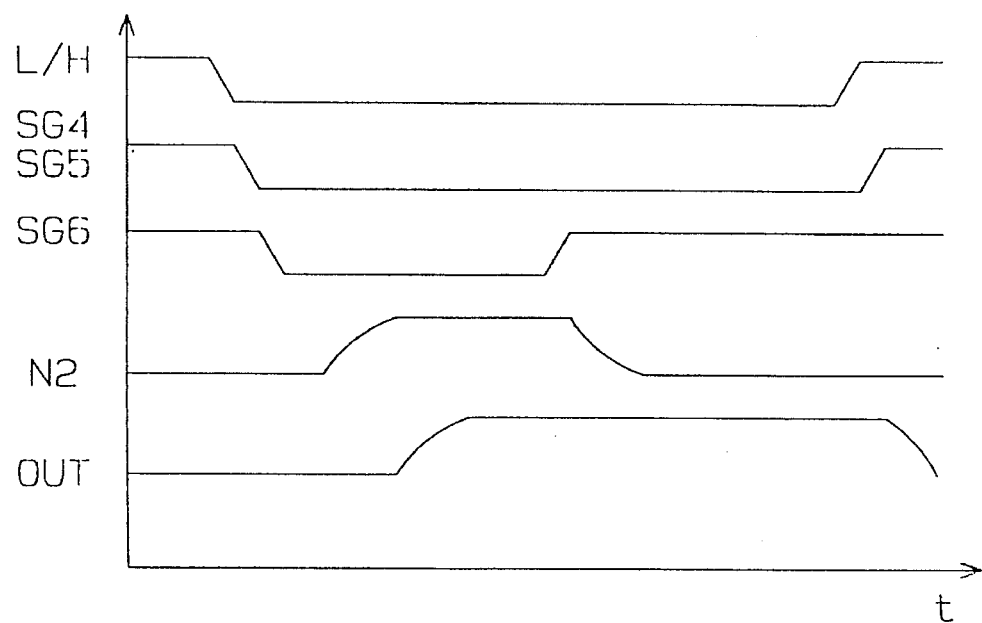
FIG. 8 is a waveform diagram illustrating the operation of the third embodiment.

FIGS. 7 and 8 illustrate an output buffer circuit according to a third embodiment of the present invention. As shown in FIG. 7, the input signal L/H and the control signal CNTL are input to the logic control circuit 20. Based on the input signal L/H and control signal CNTL, the logic control circuit 20 outputs an output signal SG4 to the gate of a P channel MOS transistor Tr10 on the pull-up side, and outputs an output signal SG5 to the gate of an N channel MOS transistor Tr11 on the pull-down side. The output signals SG4 and SG5 are in phase with the input signal L/H. The drain of the transistor Tr10 is connected to the output terminal "To" and the drain of the transistor Tr11, while the source of the transistor Tr11 is connected to the ground GND. The output signal SG4 is input to the first input terminal of the OR gate 5b whose second input terminal is connected to the output terminal "To". An output signal SG6 from the OR gate 5b is input to an inverter 4c, which comprises a P channel MOS transistor Tr12 and an N channel MOS transistor Tr13. The output signal of the inverter 4c is coupled to the source of the transistor Tr10 via a differentiating circuit, which comprises a resistor R2 and a capacitor C2. Connected to the output terminal "To" is the load circuit 2b shown in FIG. 2.

The operation of this output buffer circuit will be described with reference to FIG. 8. When the output signals SG4 and SG5 of the logic control circuit 20 go high based on the H-level input signal L/H, the transistor Tr11 is turned on and the transistor Tr10 is turned off, setting the output signal OUT to an L level. At this time, the output signal SG6 of the OR gate 5b goes high and the transistor Tr13 of the inverter 4c is turned on, permitting the charges accumulated in the capacitor C2 to be discharged to the ground GND via the resistor R2 and the transistor Tr13.

When the input signal L/H goes low the output signals SG4 and SG5 of the logic control circuit 20 are set low, the transistor Tr11 is turned off and the transistor Tr10 is turned on. Both input signals to the OR gate 5b go low, setting the output signal SG6 of this OR gate 5b to an L level. Then, the transistor Tr12 of the inverter 4c is turned on and the transistor Tr13 is turned off. This allows the drain current of the transistor Tr12 to flow to the output terminal "To" via the differentiating circuit, which comprises the resistor R2 and capacitor C2, and the transistor Tr10. As a result, the potential present at the node N2 as well as that of the output signal OUT are pulled up.

When, following this, the output signal OUT goes high, the output signal SG6 of the OR gate 5b also goes high, turning off the transistor Tr12 of the inverter 4c and turning on the transistor Tr13. This will cause the current to flow in the direction of the arrow B in FIG. 7, so that the charges accumulated in the capacitor C2 are discharged to the ground GND via the resistor R2 and the transistor Tr13.

Consequently, the current supply to the transistor Tr10 is stopped, setting the output signal OUT to a high impedance state. In this output buffer circuit, therefore, in shifting the level of the output signal OUT to the high impedance state from the L level, the potential of the output signal OUT is quickly pulled up to a level which depends on the terminal resistor of the load circuit by the differentiating circuit, so that the operation speed can be improved. After the potential of the output signal OUT is pulled up, the power supply to the transistor Tr10 from the power source Vcc is stopped, thus reducing the output buffer circuit's power consumption during periods of high impedance operation.

Fourth Embodiment

Figure 9:
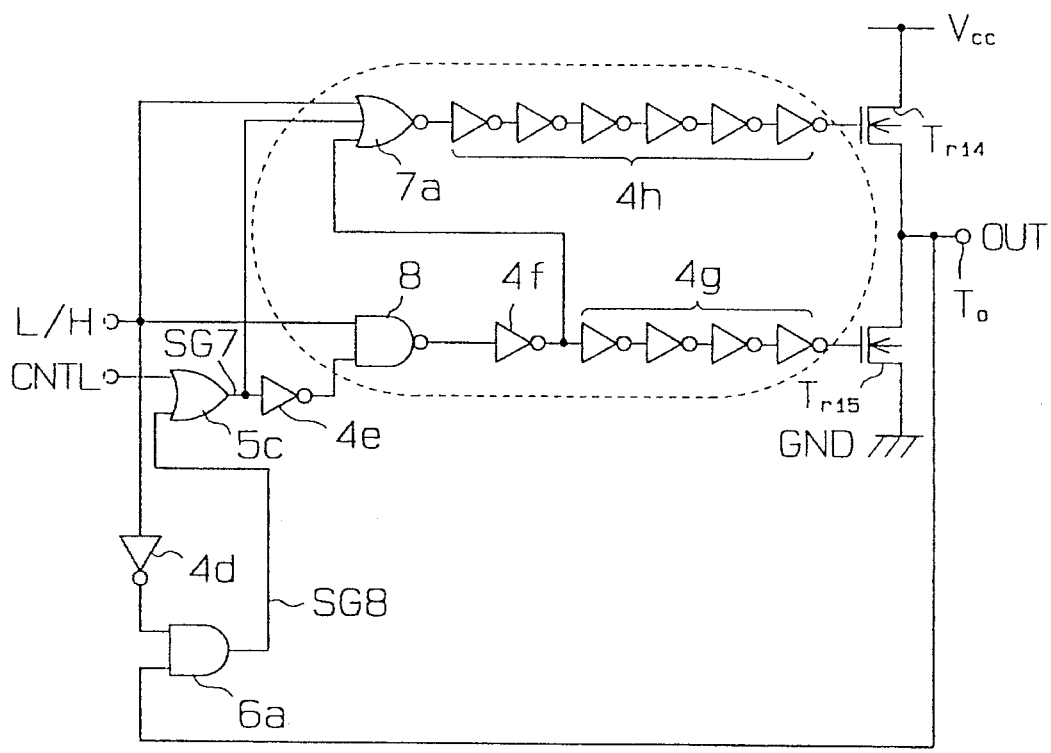
FIG. 9 is a circuit diagram showing a fourth embodiment.
Figure 10:
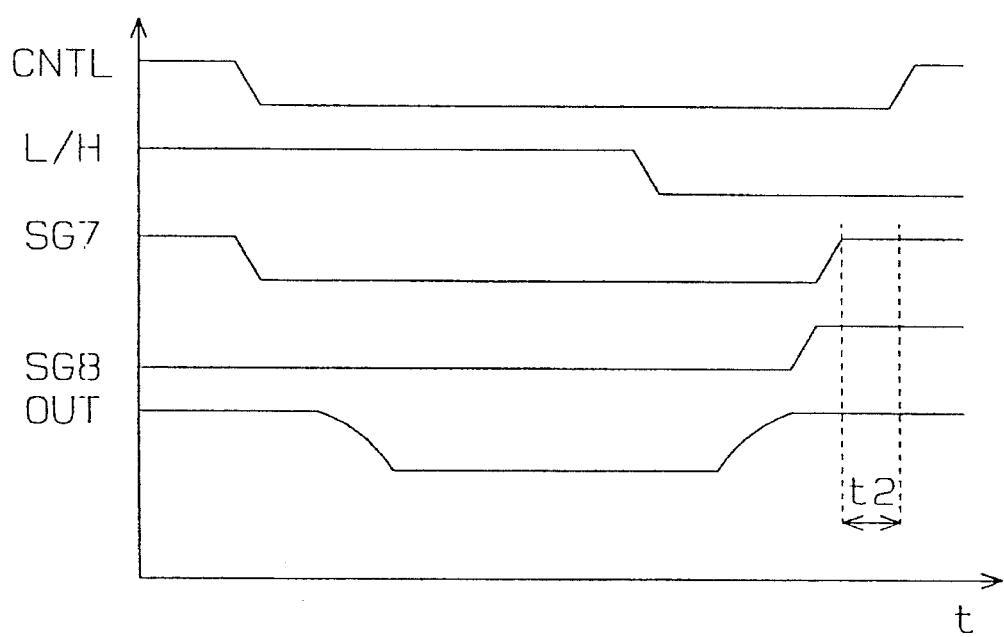
FIG. 10 is a waveform diagram illustrating the operation of the fourth embodiment.

FIGS. 9 and 10 illustrate an output buffer circuit according to a fourth embodiment of the present invention. As shown in FIG. 9, the pull-up side transistor of the output buffer circuit comprises an N channel MOS transistor Tr14 while the pull-down side transistor is comprises an N channel MOS transistor Tr15. The drain of the transistor Tr14 is connected to the power source Vcc while the source of the transistor Tr15 is connected to the ground GND. The source of the transistor Tr14 is connected to the output terminal "To" and the drain of the transistor Tr15, and the output signal OUT is output from the output terminal "To". The load circuit 2b shown in FIG. 2 is connected to the output terminal "To".

The input signal L/H is input to a NAND gate 8, a NOR gate 7a and an inverter 4d, and the control signal CNTL is input to the first input terminal of an OR gate 5c. The output signal of the inverter 4d is input to the first input terminal of an AND gate 6a whose second input terminal receives the output signal OUT output from the output terminal "To". An output signal SG8 of the AND gate 6a is input to the OR gate 5c whose output signal SG7 is input to an inverter 4e and the NOR gate 7a. The output signal of the inverter 4e is input to the NAND gate 8. The output signal of the NAND gate 8 is input to an inverter 4f whose output signal is input via four stages of inverters 4g to the gate of the transistor Tr15. The output signal of the inverter 4f is input to the NOR gate 7a. The output signal of the NOR gate 7a is input via six stages of inverters 4h to the gate of the transistor Tr14.

The operation of this output buffer circuit will be described with reference to FIG. 10. With a high level control signal CNTL and a high level input signal L/H, the output signal SG7 of the OR gate 5c goes high and the output signal SG8 of the AND gate 6a goes low. Consequently, the output signal of the inverter 4e goes low and the output signal of the NAND gate 8 goes high. The output signal of the inverters 4g therefore goes low, which turns off the transistor Tr15. Based on the H level input signal L/H and the H level output signal SG7 of the OR gate 5c, the output signal of the NOR gate 7a goes low. The output signal of the inverters 4h therefore goes low, which turns off the transistor Tr14. As a result, the transistors Tr14 and Tr15 are both turned off, setting the output signal OUT to a high impedance state.

When the control signal CNTL goes low thereafter, the output signal SG7 of the OR gate 5c goes low because the output signal SG8 of the AND gate 6a is still at an L level. Then, the output signal of the NAND gate 8 goes low and the output signal of the inverters 4g goes high, turning on the transistor Tr15. In accordance with the H-level input signal L/H, the output signal of the NOR gate 7a goes low and the transistor Tr14 remains turned off. Therefore, the output signal OUT goes low.

When the input signal L/H goes low then, the output signal of the NAND gate 8 goes high and the output signal of the inverters 4g goes low, thus turning off the transistor Tr15. As the individual input signals of the NOR gate 7a all go low, the output signal of this NOR gate 7a goes high. This sets the output signal of the inverters 4h to an H level, turning on the transistor Tr14. At this time, the rising of the output signal of the inverters 4h lags from the falling of the output signal of the inverters 4g. As a result, the transistor Tr14 is turned on after the transistor Tr15 is turned off, thus preventing the generation of a current passing through the transistors Tr14 and Tr15. When the output signal OUT goes high, the output signal SG8 of the AND gate 6a goes high because the output signal of the inverter 4d is at an H level. Based on the output signal SG8, the output signal SG7 of the OR gate 5c goes high. Then, the output signal of the NOR gate 7a goes low and the transistor Tr14 is turned off after a delay time t2 which is provided by the operational time of the inverters 4h. Subsequently, the output signal of the NAND gate 8 goes high so that the transistor Tr15 remains turned off. As a result, the output signal OUT is output as a high impedance signal. In this output buffer circuit, therefore, following the impedance shift of signal OUT from low to high, the ON action of the transistor Tr14 causes the potential of the output signal OUT to be quickly pulled up to a level depending on the terminal resistor of the load circuit. Therefore, the output buffer circuit's operational speed can be increased. After the potential of the output signal OUT is pulled up, the transistor Tr14 is turned off and the current supply to the output terminal "To" from the power source Vcc is stopped. Accordingly, the consumed power in the high impedance state can be reduced. The above individual circuits to drive the transistors Tr14 and Tr15 may be formed in the logic control circuit 20 as described in the sections of the first to third embodiments, the output buffer circuit which executes the above-described operation can be formed without modifying the existing output buffer circuit comprising the transistors Tr14 and Tr15.

Fifth Embodiment

Figure 11:
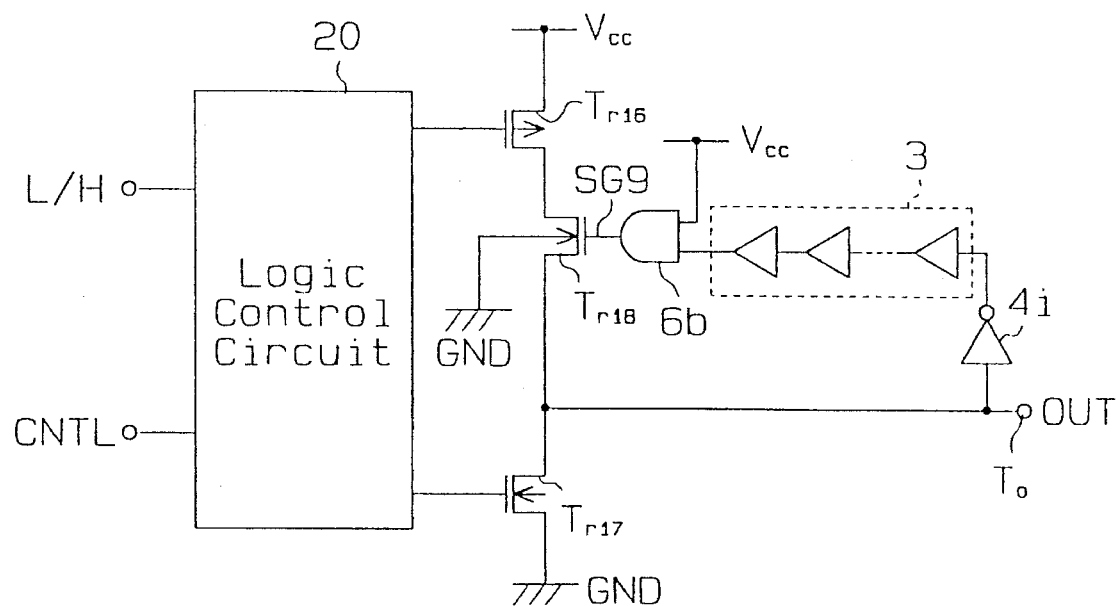
FIG. 11 is a circuit diagram showing a fifth embodiment.
Figure 12:
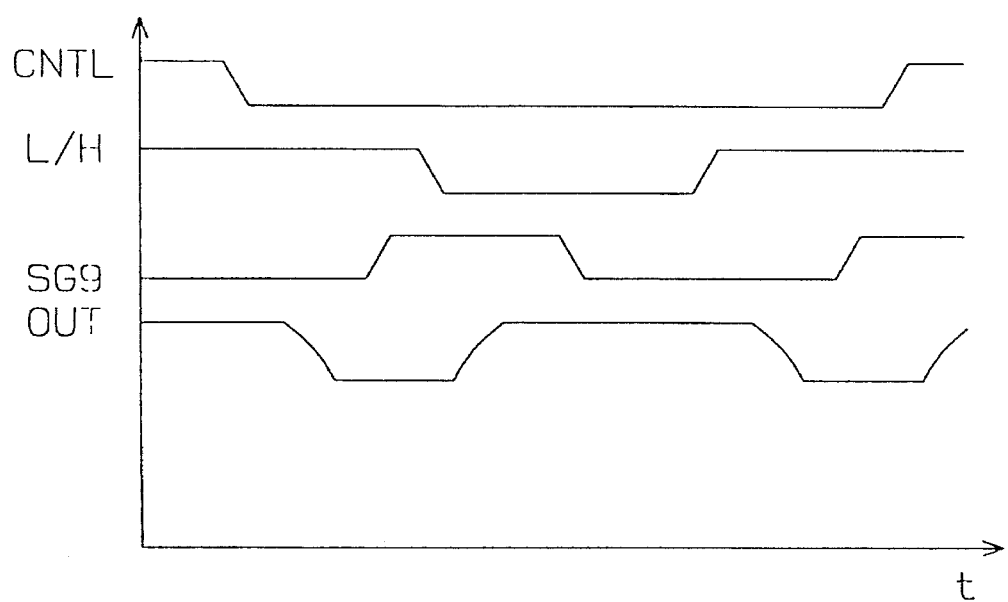
FIG. 12 is a waveform diagram illustrating the operation of the fifth embodiment.

FIGS. 11 and 12 illustrate an output buffer circuit according to a fifth embodiment of the present invention. As shown in FIG. 11, the input signal L/H and the control signal CNTL are input to the logic control circuit 20, and the output signal of the logic control circuit 20 is output to the gates of a pull-up side P channel MOS transistor Tr16 and a pull-down side N channel MOS transistor Tr17. The source of the transistor Tr16 is connected to the power source Vcc, while the drain of the transistor Tr16 is connected to the drain of a leakage current preventing N channel MOS transistor Tr18. The source of the transistor Tr18 is connected to the output terminal "To" and the drain of the transistor Tr17 whose source is connected to the ground GND. The load circuit 2b shown in FIG. 2 is connected to the output terminal "To".

The output signal OUT output from the output terminal "To" is input to the first input terminal of the AND gate 6b via an inverter 4i and the delay circuit 3, which has plural stages of buffer circuits connected in series as per the first embodiment. The inverter 4i is set in such a way that the potential at the output terminal "To" with the output signal OUT in a high impedance state is recognized as an H level. The power from the power source Vcc is input to the second input terminal of the AND gate 6b. With a predetermined voltage, e.g., 5 V, supplied as the source voltage Vcc, an H-level signal is always input to the AND gate 6b. The power to transistor Tr18 is disconnected when transistor Tr16 is turned off. In other words, an L-level signal is input to this AND gate 6b. An output signal SG9 of the AND gate 6b is input to the gate of the transistor Tr18. The back gate of the transistor Tr18 is connected to the ground GND. When the input signal L/H and control signal CNTL are both at an H level, the logic control circuit 20 outputs an H-level signal to the gate of the transistor Tr16 and an L-level signal to the gate of the transistor Tr17. When the input signal L/H goes high and the control signal CNTL goes low, the logic control circuit 20 outputs an H-level signal to the gates of the transistors Tr16 and Tr17. When the input signal L/H and control signal CNTL both go low, the logic control circuit 20 outputs an L-level signal to the gates of the transistors Tr16 and Tr17.

The operation of the thus constituted output buffer circuit will be described with reference to FIG. 12. When the input signal L/H and control signal CNTL both go high, the logic control circuit 20 turns off the transistors Tr16 and Tr17. This creates a high impedance condition under which output signal OUT is output. This condition also causes the potential at the output terminal "To" to be set a level which depends on the terminal resistor of the load circuit. Then, the output signal of the inverter 4i goes low and the output signal SG9 of the AND gate 6b goes low, thus turning off the transistor Tr18.

When the control signal CNTL goes low, the transistor Tr17 is turned on with the transistor Tr16 kept off, and the output signal OUT goes low. As a result, the output signal of the inverter 4i goes high, and the output signal SG9 of the AND gate 6b goes high, turning on the transistor Tr18. This will not affect the output signal OUT because the transistor T16 is in an OFF state. When the input signal L/H goes low next, the transistor Tr16 is turned on and the transistor Tr17 is turned off. As the transistor Tr18 is set on through the above operation, the output signal OUT goes high.

When the output signal OUT goes high through the above operation, the output signal of the inverter 4i goes low and the output signal SG9 of the AND gate 6b goes low after a delay time given by the delay circuit 3, turning off the transistor Tr18. As a result, the supply of the drain current of the transistor Tr16 to the output terminal "To" is stopped, setting the output signal OUT in a high impedance state.

In this output buffer circuit, therefore, when output signal OUT is output under high impedance conditions after being at low, the potential of the output signal OUT is quickly pulled up to the H level from the L level by the ON actions of the transistors Tr16 and Tr18. After the potential of the output signal OUT is pulled up, the transistor Tr18 is turned off, setting the output signal OUT to the high impedance state, and the potential at the output terminal "To" depends on the terminal resistor of the load circuit. Even if the output terminal "To" becomes short-circuited to the ground GND via the load circuit under the above condition, the flow of the through current to the ground GND from the power source Vcc is inhibited because the current supply to the output terminal "To" from the power source Vcc is stopped. In the case where the output signal OUT is output under high impedance conditions, the operation speed of the output buffer circuit can be improved while reducing the circuit's power consumption. When the power supply from the power source Vcc is stopped, due to the turning off on Tr16, thereby disconnecting transistor Tr18; the output signal SG9 of the AND gate 6b goes low, turning off the transistor Tr18. Even if the output terminal "To" goes high by an external load circuit under this condition, it is possible to block any leakage current flowing via the transistor Tr16 to the output terminal "To" from the power source Vcc.

Figure 13:
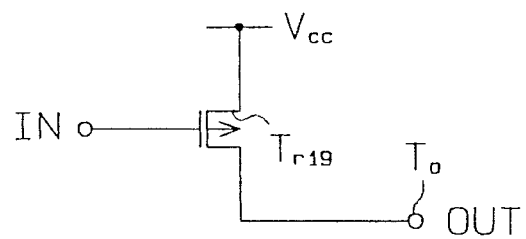
FIG. 13 is a circuit diagram showing a transistor which generates a leakage current.

A description will now be given of the reason why the leakage current preventing transistor Tr18 has been provided. As shown in FIG. 13, with the power from the power source Vcc supplied to the source of the P channel MOS transistor Tr19 whose drain is connected to the output terminal "To", when the L-level input signal IN is input to the gate of the transistor Tr19, this transistor Tr19 is turned on and the output signal OUT goes high. When the H-level input signal IN is input to the gate of the transistor Tr19, this transistor Tr19 is turned off, and the output signal OUT to be output from the output terminal "To" is set to a high impedance state.

Figure 14:
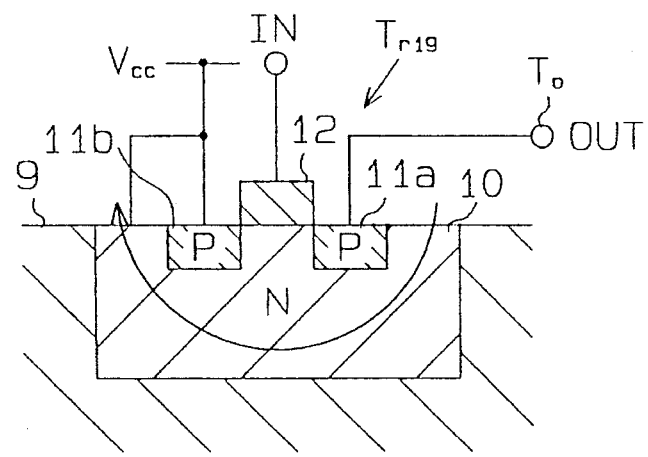
FIG. 14 is a cross-sectional view showing the transistor which generates a leakage current.

The transistor Tr19 is constituted as shown in FIG. 14. An N type well 10 is formed in a P type substrate 9, and first and second P type diffusion areas 11a and 11b are formed in the N type well 10. The first P type diffusion area 11a is connected to the output terminal "To" to form the drain, while the second P type diffusion area 11b is connected to the power source Vcc to become the source. A gate electrode 12 is formed on the N type well 10 between the P type diffusion areas 11a and 11b, with the input signal IN input to this gate electrode 12. When the power supply to the source of the transistor Tr19 from the power source Vcc is stopped, causing the input signal IN to goes low, the potential of the output terminal "To" may go high due to the function of the load circuit. At this time, the transistor Tr19 is turned on, causing a leakage current to flow toward the line that supplies the power source Vcc from the output terminal "To" in the arrowhead direction shown in FIG. 14.

Figure 15:
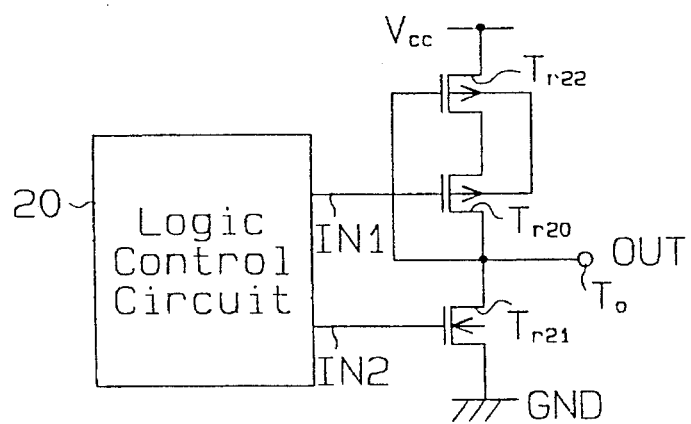
FIG. 15 is a circuit diagram showing an output buffer circuit having a leakage current preventing transistor.

FIG. 15 shows an output buffer circuit which prevents the generation of the leakage current. Input signals IN1 and IN2 from the logic control circuit 20 are input to the gates of a pull-up side P channel MOS transistor Tr20 and a pull-down side N channel MOS transistor Tr21, and the source of this transistor Tr20 is connected to the power source Vcc via a leakage current preventing P channel MOS transistor Tr22. The gate of the transistor Tr22 is connected to the output terminal "To", while its back gate is connected to the back gate of the transistor Tr20. The drains of the transistors Tr20 and Tr21 are connected to the output terminal "To" and the source of the transistor Tr21 is connected to the ground GND.

Figure 16:
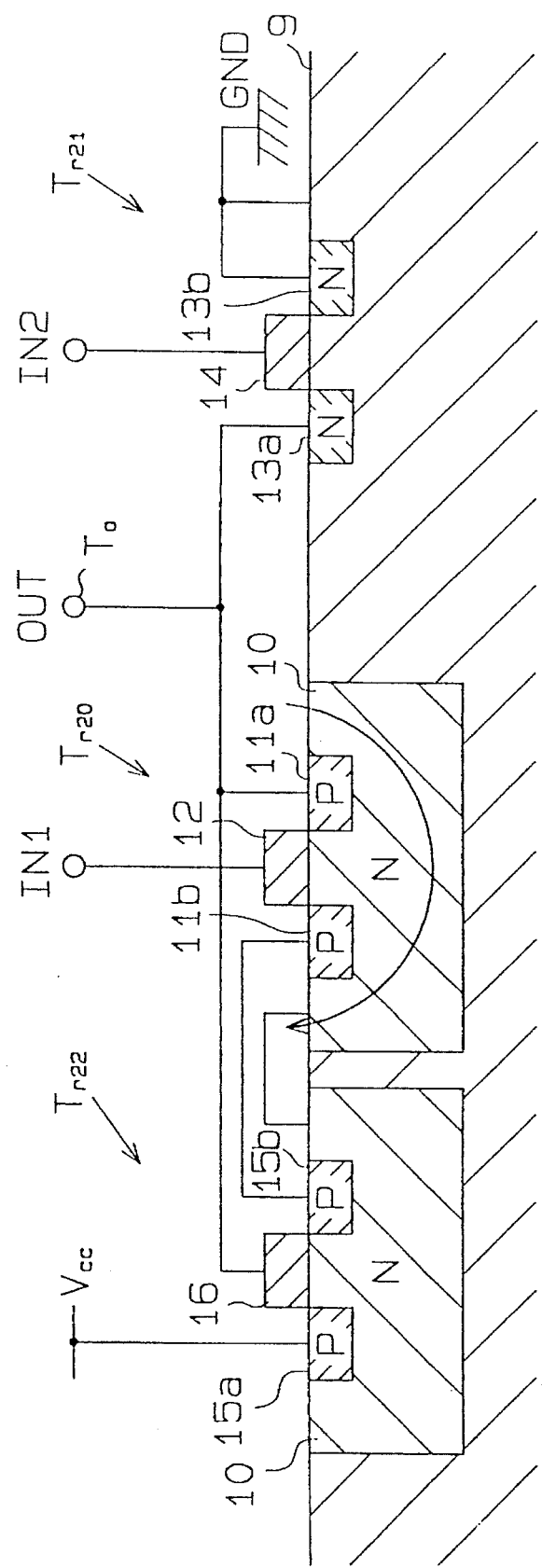
FIG. 16 is a cross-sectional view showing the output buffer circuit having the leakage current preventing transistor.

FIG. 16 shows the structures of the transistors Tr20 to Tr22. The transistors Tr20 to Tr22 are formed on a P type substrate 9 in the same manner as the transistor Tr19 shown in FIG. 14, with the input signal IN1 input to the gate electrode 12. N type diffusion areas 13a and 13b, which constitute the transistor Tr21, are formed on the P type substrate 9, and a gate electrode 14 is formed on the P type substrate 9 between the N type diffusion areas 13a and 13b, with the input signal IN2 input to the gate electrode 14. The N type diffusion area 13b is connected to the ground GND, while the N type diffusion area 13a is connected to the output terminal "To". P type diffusion areas 15a and 15b of the transistor Tr22 are formed in the N type well 10 formed in the P type substrate 9 like in the transistor Tr20. A gate electrode 16 is formed on the P type substrate 9 between the P type diffusion areas 15a and 15b, and is connected to the output terminal "To". The source voltage Vcc is supplied to the P type diffusion area 15a, and the P type diffusion area 15b is connected to the P type diffusion area 11b which is the source of the transistor Tr20. The P type diffusion area 11a which is the drain of the transistor Tr20 is connected to the output terminal "To".

In such an output buffer circuit, when the transistor Tr20 is turned off and the transistor Tr21 is turned on by the function of the logic control circuit 20, the output signal OUT goes low. Under this condition, the transistor Tr22 is turned on and the power source Vcc is supplied to the source of the transistor Tr20. When the transistor Tr20 is turned on and the transistor Tr21 is turned off next by the function of the logic control circuit 20, the current flows to the output terminal "To" via the transistors Tr22 and Tr20 from the source voltage Vcc, causing the output signal OUT to go high. Then, the transistor Tr22 is turned off and the output signal OUT becomes a high impedance state, so that the potential at the output terminal "To" is determined by the terminal resistor connected to the output terminal "To". At the time the output signal OUT goes high from being low, therefore, no ringing will occur in the output signal OUT.

Even when the power supply from the power source Vcc is stopped with the output terminal "To" set to an H level by the load circuit, the transistor Tr22 is turned off so that the leakage current to the power supply line of the power source Vcc from the output terminal "To" is blocked by this transistor Tr22. Therefore, the current which flows from the output terminal "To" in the arrowhead direction in FIG. 16 is blocked by the transistor Tr22, making it possible to surely prevent the generation of the leakage current. In the fifth embodiment, the gate signal to the leakage current preventing transistor Tr18 is controlled to prevent the generation of the leakage current, to improve the operation speed and to reduce the power consumed in the output buffer circuit.

Figure 17:
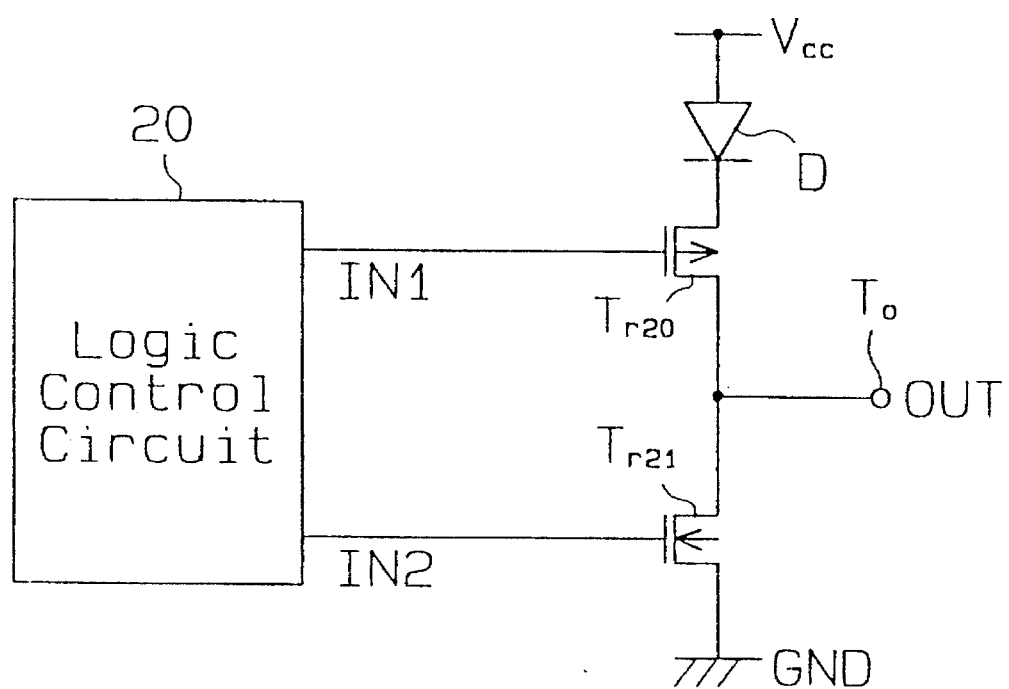
FIG. 17 is a circuit diagram showing another output buffer circuit having a leakage current preventing transistor.

While the output buffer circuit shown in FIGS. 15 and 16 is designed to prevent ringing on the output signal OUT and the flow of the leakage current to the power source Vcc from the output terminal "To", the following structure may also be employed to prevent the leakage current. As shown in FIG. 17, the input signals IN1 and IN2 from the logic control circuit 20 are respectively input to the gates of the pull-up side P channel MOS transistor Tr20 and the pull-down side N channel MOS transistor Tr21. The source of the transistor Tr20 is connected to the cathode of a leakage current preventing diode D whose anode is connected to the power source Vcc. The drains of the transistors Tr20 and Tr21 are connected to the output terminal "To" and the source of the transistor Tr21 is connected to the ground GND.

Figure 18:
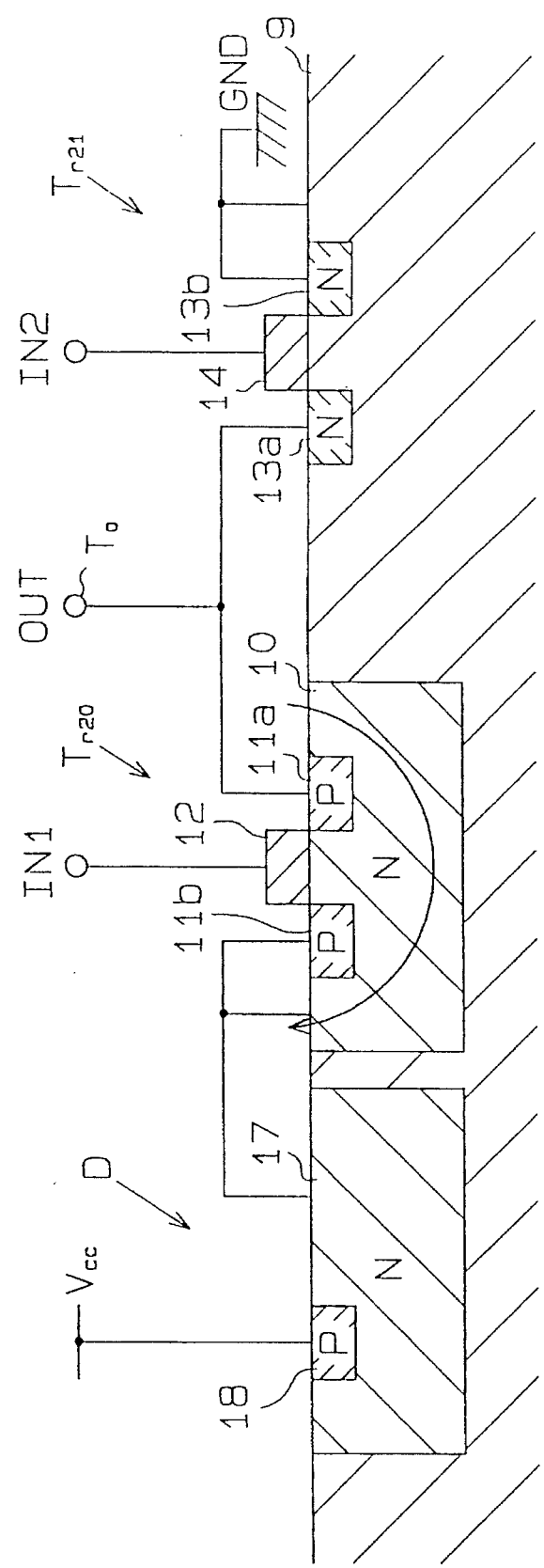
FIG. 18 is a cross-sectional view showing this output buffer circuit having the leakage current preventing transistor.

FIG. 18 shows the structure of the output buffer circuit, which comprises the transistors Tr20 and Tr21 and the diode D, on the substrate. The transistors Tr20 and Tr21 are formed on the P type substrate 9, and the transistor Tr20 is constituted in the same manner as the transistor Tr19 shown in FIG. 14, with the input signal IN1 input to its gate 12. The N type diffusion areas 13a and 13b comprising the transistor Tr21 are formed on the P type substrate 9, and the gate electrode 14 is formed on the substrate between the N type diffusion areas 13a and 13b, with input signal IN2 input to the gate electrode 14. The N type diffusion area 13b is connected to the ground GND, while the N type diffusion area 13a is connected to the output terminal "To". The P type diffusion area 18 constituting the diode D is formed in the N type well 17 formed in the P type substrate 9, and is connected to the power source Vcc. The N type well 17 is connected to the P type diffusion area 11b constituting the transistor Tr20.

In this output buffer circuit, when the transistor Tr20 is turned off and the transistor Tr21 is turned on by the function of the logic control circuit 20, the output signal OUT goes low. When the transistor Tr20 is turned on and the transistor Tr21 is turned off next by the function of the logic control circuit 20, the current flows to the output terminal "To" via the transistor Tr20 from the power source Vcc, causing the output signal OUT to go high. When the transistors Tr20 and Tr21 are both turned off, the output signal OUT gets output under high impedance condition. Even when the transistor Tr20 is turned on and the output terminal "To" goes high with the power source Vcc blocked, the diode D functions to prevent the flow of the leakage current to the power supply line of the power source Vcc from the output terminal "To".

Sixth Embodiment

Figure 19:
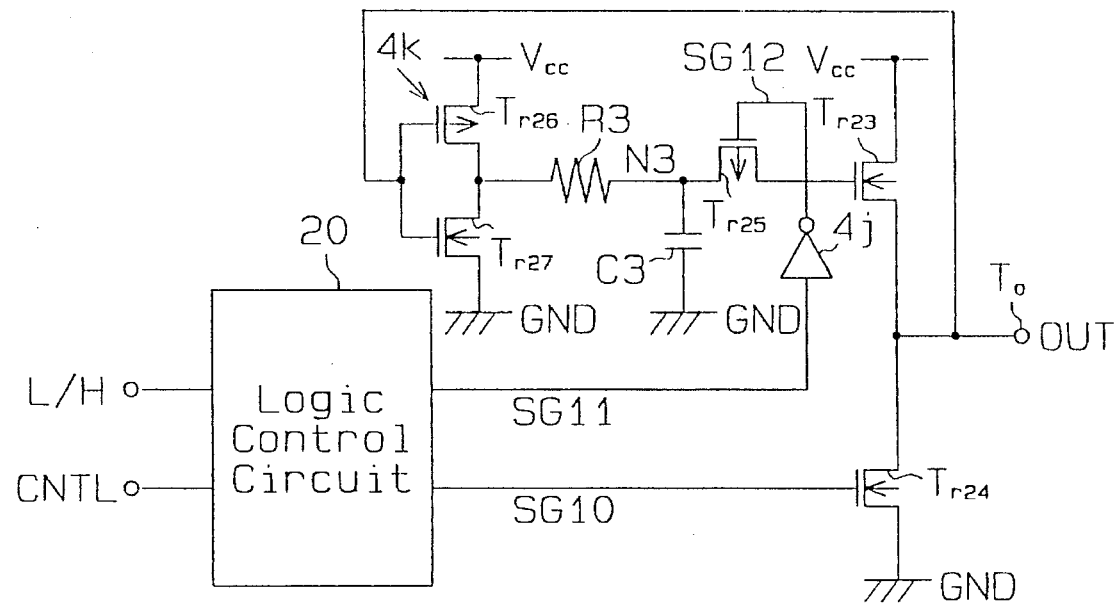
FIG. 19 is a circuit diagram showing a sixth embodiment.
Figure 20:
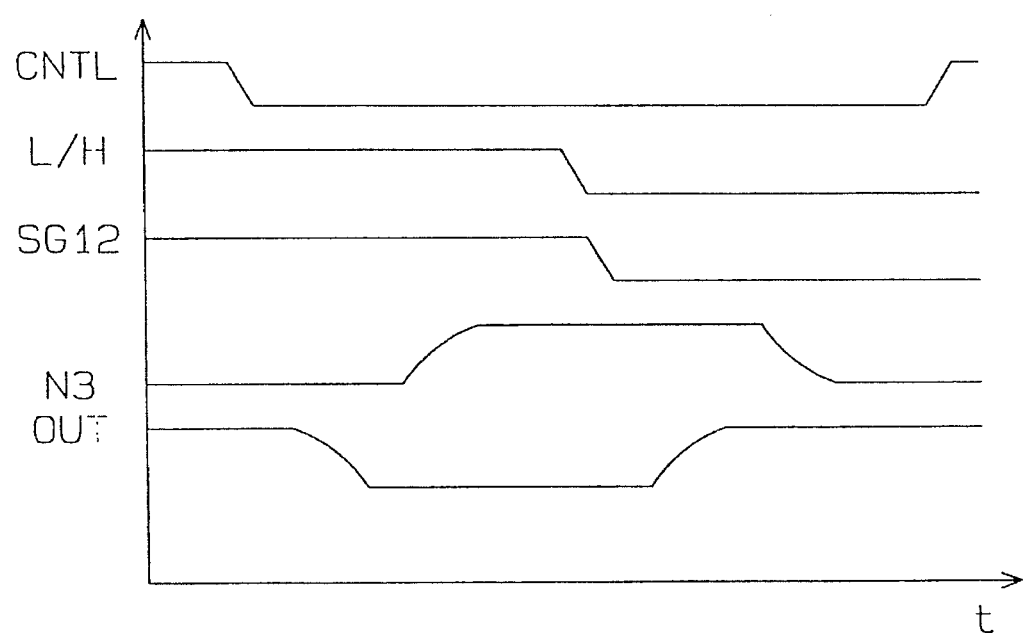
FIG. 20 is a waveform diagram illustrating the operation of the sixth embodiment.

FIGS. 19 and 20 illustrate an output buffer circuit according to a sixth embodiment of the present invention. As shown in FIG. 19, the input signal L/H and control signal CNTL are input to the logic control circuit 20. Based on the input signal L/H and control signal CNTL, the logic control circuit 20 drives a pull-up side N channel MOS transistor Tr23 and a pull-down side N channel MOS transistor Tr24. When the input signal L/H and control signal CNTL both go high, output signals SG10 and SG11 of the logic control circuit 20 both go low. When the input signal L/H goes high and the control signal CNTL goes low, the output signal SG10 of the logic control circuit 20 goes high and the output signal SG11 remains the L level. When the input signal L/H goes low and the control signal CNTL also goes low, the output signal SG10 of the logic control circuit 20 goes low and the output signal SG11 goes high.

The output signal SG10 is input to the gate of the transistor Tr24. The transistor Tr24 has its drain connected to the output terminal "To" and the source of the transistor Tr23, and its source connected to the ground GND. The output signal SG11 is input to an inverter 4j whose output signal SG12 is input to the gate of a P channel MOS transistor Tr25.

The output signal OUT, which is to be output from the output terminal "To", is input to an inverter 4k, which comprises a P channel MOS transistor Tr26 and an N channel MOS transistor Tr27. The output signal of the inverter 4k is coupled via a resistor R3 to the source of the transistor Tr25 whose drain is connected to the gate of the transistor Tr23. The drain of the transistor Tr23 is connected to the power source Vcc. The source (node N3) of the transistor Tr25 is connected via a capacitor C3 to the ground GND. The resistor R3 and capacitor C3 constitute an integrator. The load circuit 2b shown in FIG. 2 is connected to the output terminal "To".

The operation of this output buffer circuit will be described with reference to FIG. 20. When the output signals SG10 and SG11 of the logic control circuit 20 both go low based on the H-level input signal L/H and control signal CNTL, the transistor Tr24 is turned off and the transistor Tr25 is also turned off. As a result, the transistor Tr23 is turned off, setting the output signal OUT to a high impedance state. When the control signal CNTL goes low then, the output signal SG10 of the logic control circuit 20 goes high to turn on the transistor Tr24, setting the output signal OUT to an L level. Consequently, the transistor Tr26 of the inverter 4k is turned on, permitting the charged current to flow to the capacitor C3 via the resistor R3 so that the potential at the node N3 rises based on a time constant determined by the resistor R3 and capacitor C3.

When the input signal L/H goes low then, the output signals SG10 and SG11 of the logic control circuit 20 respectively go low and high. As a result, the output signal SG12 of the inverter 4j goes low, turning on the transistor Tr25, so that the potential at the node N3 is input to the gate of the transistor Tr23 to turn this transistor Tr23 on. The ON action of the transistor Tr23 sets the output signal OUT to an H level. Consequently, the transistor Tr27 of the inverter 4k is turned on, causing the charge accumulated in the capacitor C3 to be discharged via the resistor R3 and transistor Tr27 to the ground GND. This drops the potential at the node N3 based on the time constant, determined by the resistor R3 and capacitor C3. As a result, the transistor Tr23 is turned off, setting the output signal OUT to a high impedance state.

In this output buffer circuit, therefore, given the output of output signal OUT during a change from a low to high impedance, the transistor Tr23 is turned on by the aforementioned integrator, allowing the output signal OUT to be quickly pulled up to the H level. This will improve the operation speed. After the potential of the output signal OUT is pulled up, the transistor Tr23 is turned off to inhibit the current supply to the output terminal "To", so that the power consumed by the circuit during a condition of high impedance state can be reduced.

Seventh Embodiment

Figure 21:
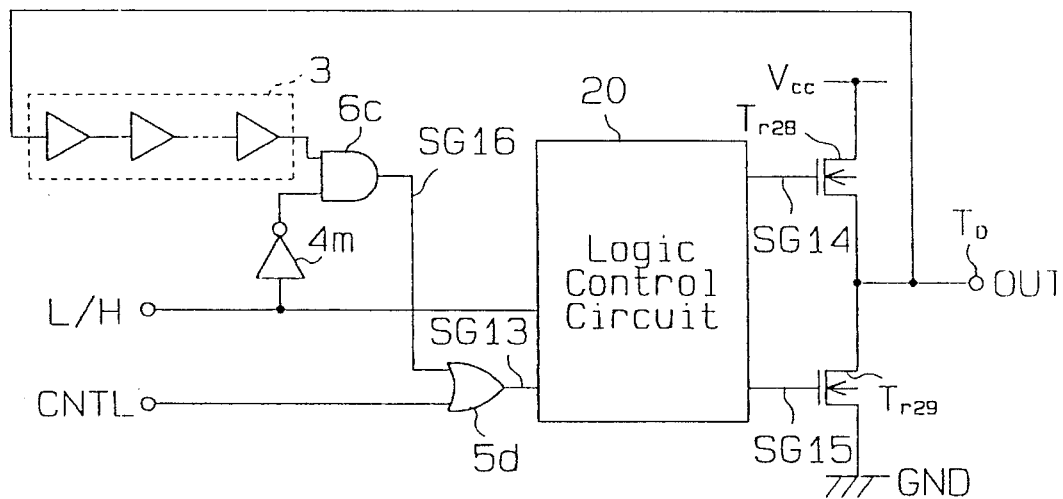
FIG. 21 is a circuit diagram showing a seventh embodiment.
Figure 22:
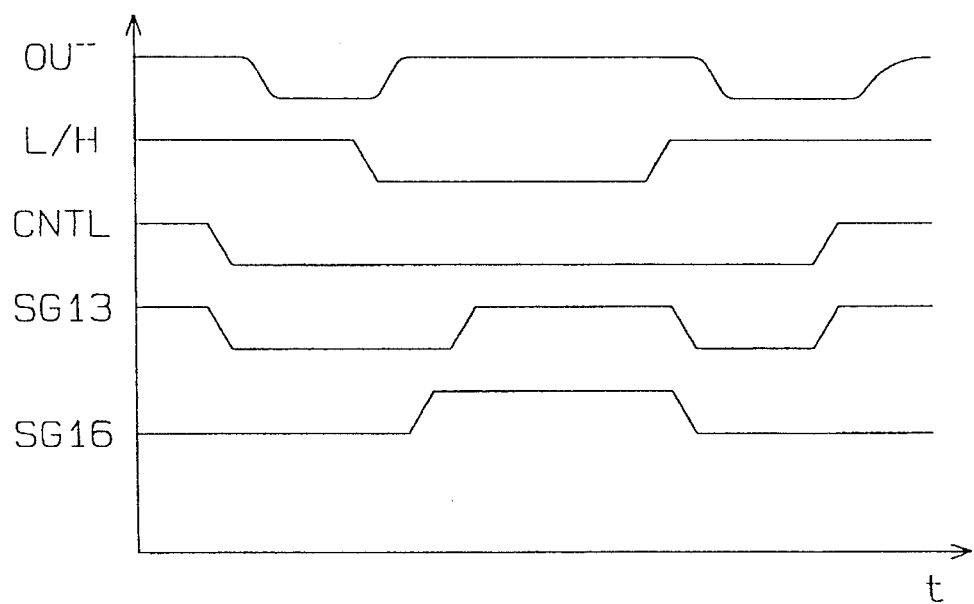
FIG. 22 is a waveform diagram illustrating the operation of the seventh embodiment.

FIGS. 21 and 22 illustrate an output buffer circuit according to a seventh embodiment of the present invention. As shown in FIG. 21, the input signal L/H is input to the logic control circuit 20 and an inverter 4m. The control signal CNTL is input to the first input terminal of an OR gate 5d whose output signal SG13 is input to the logic control circuit 20. The logic control circuit 20 outputs output signals SG14 and SG15 to drive a pull-up side N channel MOS transistor Tr28 and a pull-down side N channel MOS transistor Tr29. The output signal SG14 from the logic control circuit 20 is input to the gate of the transistor Tr28. The transistor Tr28 has its drain connected to the power source Vcc and its source connected to the output terminal "To" and the drain of the transistor Tr29. The load circuit 2b shown in FIG. 2 is connected to the output terminal "To".

The output signal SG15 of the logic control circuit 20 is input to the gate of the transistor Tr29 whose source is connected to the ground GND. When the input signal L/H goes high and the output signal SG13 goes low, the logic control circuit 20 turns the transistor Tr29 on and turns the transistor Tr28 off. When the input signal L/H goes low and the output signal SG13 goes low, the logic control circuit 20 turns the transistor Tr29 off and turns the transistor Tr28 on. When the input signal SG13 goes high, the logic control circuit 20 turns off both the transistors Tr28 and Tr29, irrespective of the level of the input signal L/H. The output signal OUT is input to the first input terminal of an AND gate 6c via the delay circuit 3, which comprises plural stages of buffer circuits connected in series. The output signal of the inverter 4m is input to the second input terminal of the AND gate 6c. An output signal SG16 of the AND gate 6c is input to the OR gate 5d.

The operation of this output buffer circuit will be described with reference to FIG. 22. When the H-level input signal L/H is input to the logic control circuit 20 and the H-level output signal SG13 is input to the logic control circuit 20 from the OR gate 5d based on the H-level control signal CNTL, the output signals SG14 and SG15 of the logic control circuit 20 both go low. As a result, the transistors Tr28 and Tr29 are both turned off, outputting the output signal OUT during a high impedance state. At this time, the output signal SG16 of the AND gate 6c goes low. When the control signal CNTL goes low then, the output signal SG13 of the OR gate 5d goes low. This sets the output signal SG15 of the logic control circuit 20 to an H level to turn on the transistor Tr29, setting the output signal OUT to an L level.

When the input signal L/H goes low next, the output signal SG15 of the logic control circuit 20 goes low and the output signal SG14 goes high. Consequently, the transistor Tr28 is turned on and the transistor Tr29 is turned off. The ON action of the transistor Tr28 sets the output signal OUT to an H level. After a delay time given by the delay circuit 3, the output signal SG16 of the AND gate 6c goes high based on whether the output signal SG13 of the OR gate 5d goes high. As a result, the transistor Tr28 is turned off, setting the output signal OUT to a high impedance state.

In this output buffer circuit, therefore, when the level of the output signal OUT is shifted to the high impedance state from the L level, the transistor Tr28 is turned on, allowing the output signal OUT to be quickly pulled up to the H level. After the potential of the output signal OUT is pulled up, the transistor Tr28 is turned off so that the potential at the output terminal "To" quickly converges to the potential according to the terminal resistor of the load circuit. This will improve the operation speed. After the potential of the output signal OUT is pulled up, the transistor Tr28 is turned off to block the current supply to the output terminal "To", so that the power consumed by the circuit in a high impedance state can be reduced. Further, the above circuit for generating the output signal SG13 based on the input signal L/H and the control signal CNTL may be incorporated in the internal circuit at the previous stage of the logic control circuit 20. The output buffer circuit which executes the above-described operation can be formed without modifying the existing output buffer circuit comprising the logic control circuit 20 and the transistors Tr28 and Tr29.

Eighth Embodiment

Figure 23:
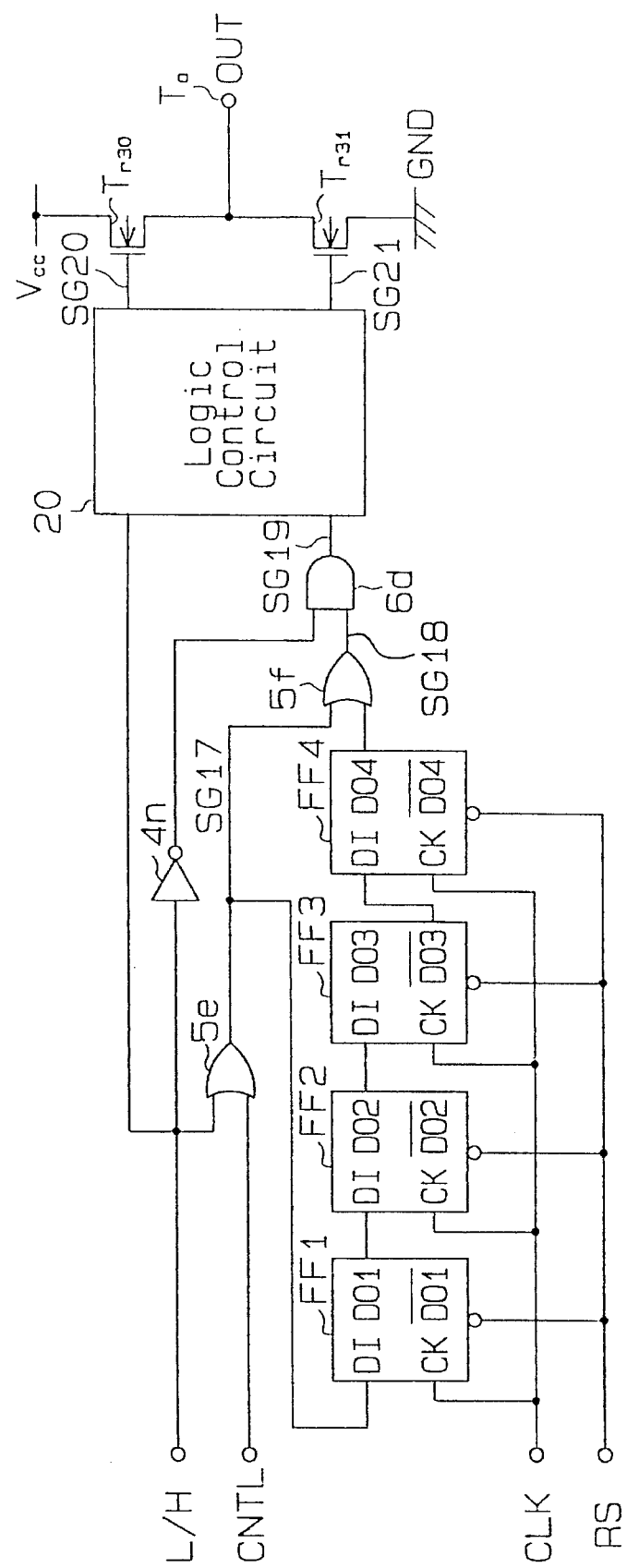
FIG. 23 is a circuit diagram showing an eighth embodiment.
Figure 24:
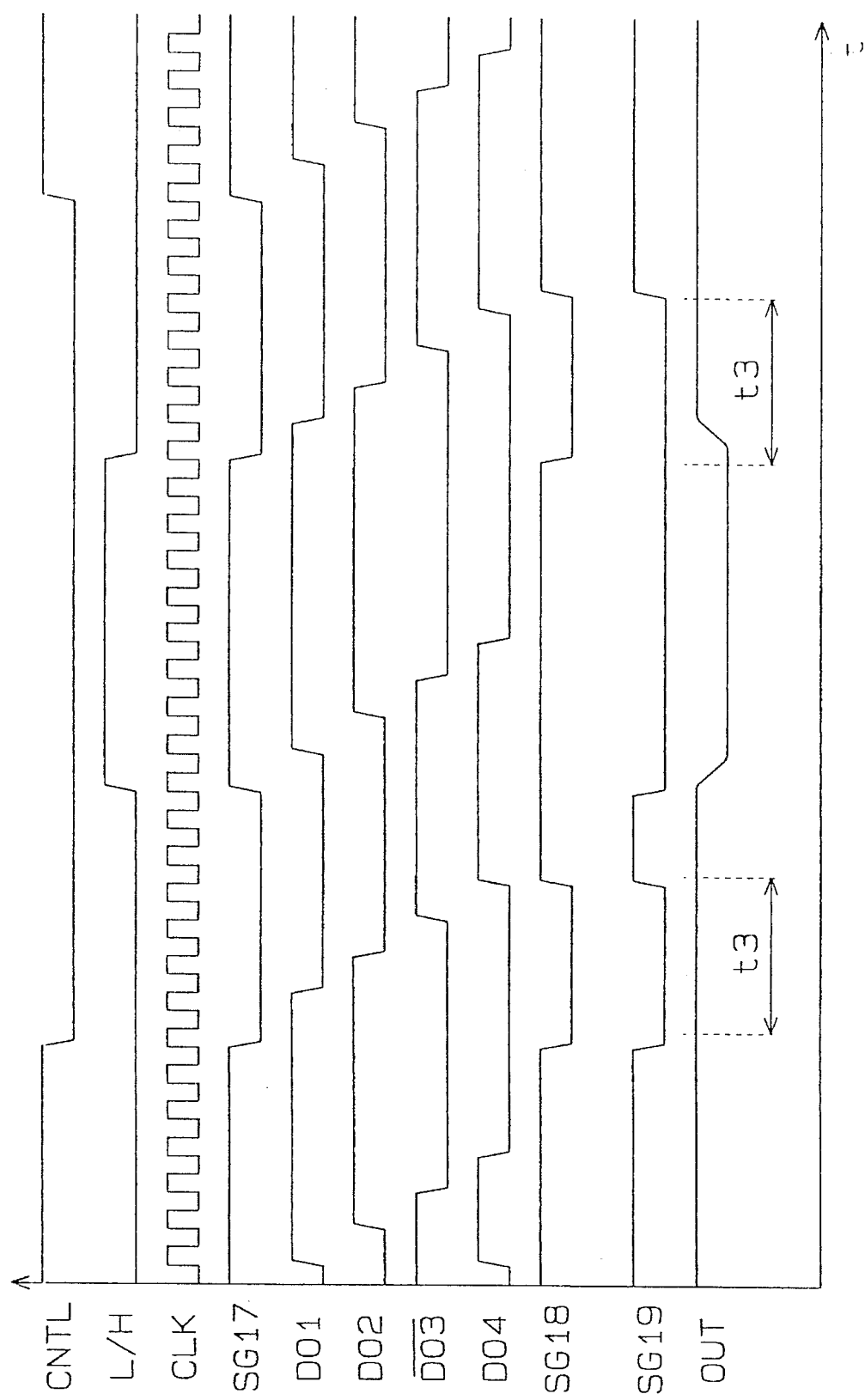
FIG. 24 is a waveform diagram illustrating the operation of the eighth embodiment.

FIGS. 23 and 24 illustrate an output buffer circuit according to an eighth embodiment of the present invention. As shown in FIG. 23, the input signal L/H is input to the logic control circuit 20, an inverter 4n and the first input terminal of an OR gate 5e. The control signal CNTL is input to the second input terminal of the OR gate 5e whose output signal SG17 is input to the first input terminal of an OR gate 5f. Four stages of flip-flops FF1 to FF4 receive a clock signal CLK and a reset signal RS, which are output from the internal circuit. The flip-flop FF1 receives the output signal SG17 of the OR gate 5e as input data DI.

The flip-flop FF1 outputs an output signal DO1 in phase with the input data DI to the next stage of flip-flop FF2, based on the rising of the clock signal CLK. The flip-flop FF2 outputs an output signal DO2 in phase with the input data DI from the flip-flop FF1, to the next stage of flip-flop FF3, based on the rising of the clock signal CLK. The flip-flop FF3 outputs an output signal bar DO3 in phase with the input data DI from the flip-flop FF2, to the next stage of flip-flop FF4, based on the rising of the clock signal CLK. The flip-flop FF4 outputs an output signal DO4 in phase with the input data DI from the flip-flop FF3, to the second input terminal of the OR gate 5f, based on the rising of the clock signal CLK. Therefore, the input data DI input to the flip-flop FF1 will be output in an inverted form as the output signal DO4 from the flip-flop FF4 after four cycles of the clock signal CLK pass. For instance, provided that the frequency of the clock signal CLK is 100 Mhz, the time t3 for the four cycles (see FIG. 24) is 40 ns.

An output signal SG18 of the OR gate 5f is input to the first input terminal of an AND gate 6d which receives, at its second input terminal, the output signal of the inverter 4n. An output signal SG19 of the AND gate 6d is input to the logic control circuit 20. The logic control circuit 20 outputs output signals SG20 and SG21 to drive a pull-up side N channel MOS transistor Tr30 and a pull-down side N channel MOS transistor Tr31. More specifically, the output signal SG20 of the logic control circuit 20 is input to the gate of the transistor Tr30 whose drain is connected to the power source Vcc with the source connected to the output terminal "To" and the drain of the transistor Tr31. Further, the output signal SG21 of the logic control circuit 20 is input to the gate of the transistor Tr31 whose source is connected to the ground GND. The load circuit 2b shown in FIG. 2 is connected to the output terminal "To".

When the input signal L/H goes high, the logic control circuit 20 turns on the transistor Tr31 and turns off the transistor Tr30, regardless of the level of the output signal SG19. When the input signal L/H goes low and the output signal SG19 goes low, the logic control circuit 20 turns off the transistor Tr31 and turns on the transistor Tr30. When the input signal L/H goes low and the output signal SG19 goes high, the logic control circuit 20 turns off both the transistors Tr30 and Tr31.

The operation of this output buffer circuit will be described with reference to FIG. 24. When the L-level input signal L/H is input to the logic control circuit 20, the OR gate 5e and the inverter 4n and the H-level control signal CNTL is input to the OR gate 5e, the output signal SG17 of this OR gate 5e goes high. This sets the output signal SG18 of the OR gate 5f to an H level. As the output signal of the inverter 4n goes high, the output signal SG19 of the AND gate 6d goes high. Based on the H-level output signal SG19 and the L-level input signal L/H, the output signals SG20 and SG21 of the logic control circuit 20 both go low. As a result, the transistors Tr30 and Tr31 are both turned off, causing the output signal OUT to set during a high impedance stage.

When the control signal CNTL goes low with the input signal L/H kept at the L level then, the output signal SG17 of the OR gate 5e goes low. Consequently, the output signal SG18 of the OR gate 5f goes low, and the output signal SG19 of the AND gate 6d goes low. Based on the L-level output signal SG19 and the L-level input signal L/H, the output signals SG20 and SG21 of the logic control circuit 20 respectively go high and low. As a result, the transistor Tr30 is turned on and the transistor Tr31 is turned off, causing the output signal OUT to go high.

As the output signal DO4 of the flip-flop FF4 goes high after four cycles of the clock signal CLK pass, the output signal SG18 of the OR gate 5f goes high. Then, the output signal SG19 of the AND gate 6d goes high, causing the output signals SG20 and SG21 of the logic control circuit 20 to both go low. As a result, the transistors Tr30 and Tr31 are both turned off, setting the output signal OUT during a high impedance state.

When the input signal L/H goes high with the control signal CNTL kept at the L level then, the output signal SG17 of the OR gate 5e goes high. Consequently, the output signal SG18 of the OR gate 5f goes high, and the output signal SG19 of the AND gate 6d goes low. Based on the L-level output signal SG19 and the H-level input signal L/H, the output signals SG20 and SG21 of the logic control circuit 20 respectively go low and high. As a result, the transistor Tr30 is turned off and the transistor Tr31 is turned on, causing the output signal OUT to go low.

When the input signal L/H goes low with the control signal CNTL set, the output signal SG17 of the OR gate 5e goes low. Then, the output signal SG18 of the OR gate 5f goes low, and the output signal SG19 of the AND gate 6d is set at the L level. Based on the L-level output signal SG19 and the L-level input signal L/H, the output signals SG20 and SG21 of the logic control circuit 20 respectively go high and low. As a result, the transistor Tr30 is turned on and the transistor Tr31 is turned off, causing the output signal OUT to go high.

As the output signal DO4 of the flip-flop FF4 goes high after four cycles of the clock signal CLK pass, the output signal SG18 of the OR gate 5f goes high. Then, the output signal SG19 of the AND gate 6d goes high, causing the output signals SG20 and SG21 of the logic control circuit 20 to both go low. As a result, the transistors Tr30 and Tr31 are both turned off, setting the output signal OUT to a high impedance state. In this output buffer circuit, therefore, when the level of the output signal OUT is shifted to the high impedance state from the L level, the transistor Tr30 is turned on, allowing the output signal OUT to be quickly pulled up to the H level. After the potential of the output signal OUT is pulled up, the transistor Tr30 is turned off so that the potential at the output terminal "To" quickly converges to the potential that depends on the terminal resistor of the load circuit. This improves the operation speed. After the potential of the output signal OUT is pulled up, the transistor Tr30 is turned off to block the current supply to the output terminal "To", so that the consumed power in the high impedance state can be reduced.

Further, the above circuit for generating the output signal SG19 based on the input signal L/H and the control signal CNTL may be incorporated in the internal circuit at the previous stage of the logic control circuit 20. Accordingly, the output buffer circuit which executes the above-described operation can be constituted by using the existing output buffer circuit comprising the logic control circuit 20 and the transistors Tr30 and Tr31.

Figure 25:
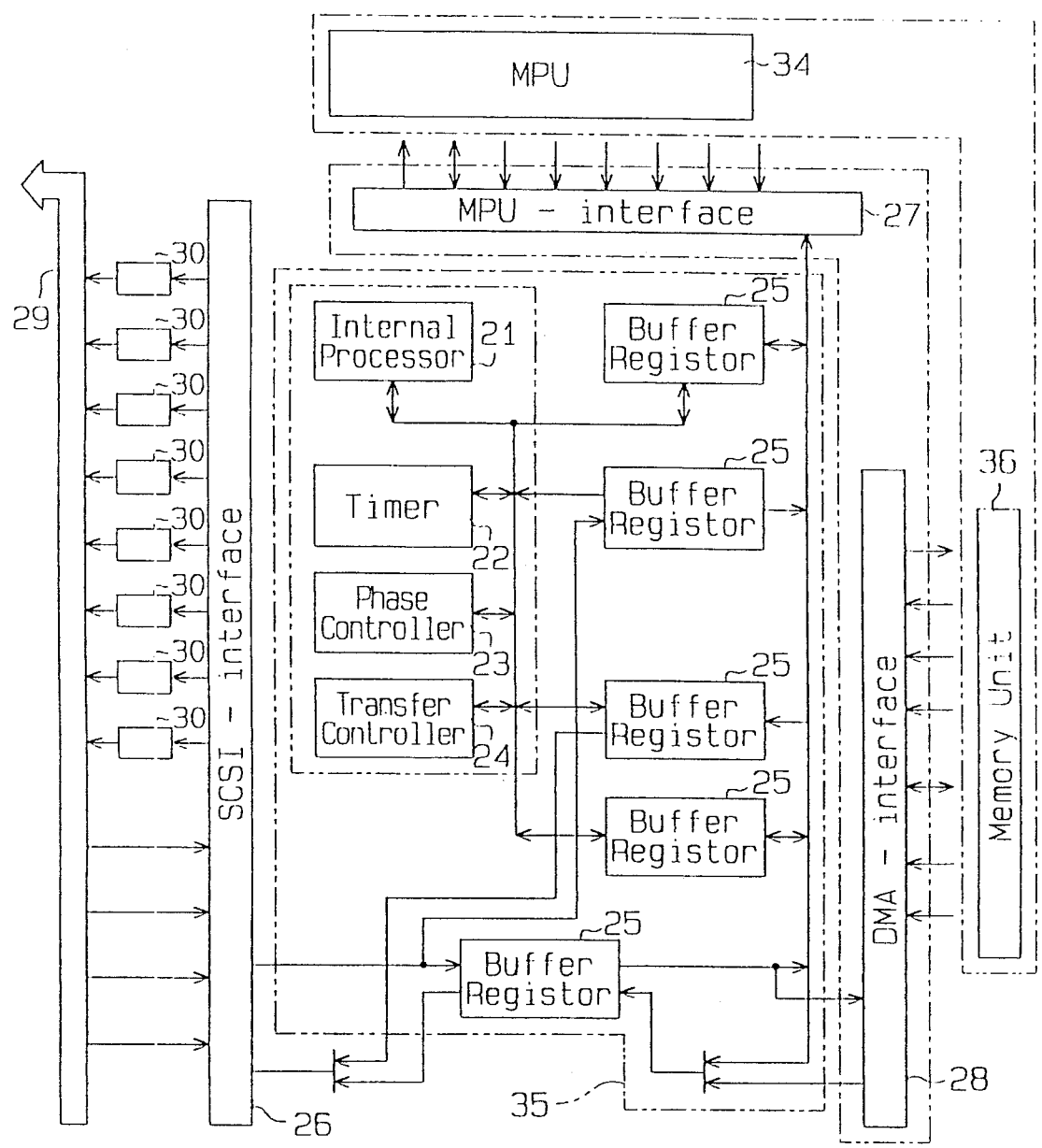
FIG. 25 illustrates a Small Computer System Interface (SCSI) Protocol controller.

The output buffer circuit in each of the above described embodiments is used with a Small Computer System Interface (SCSI) Protocol controller 35 illustrated in FIG. 25. The SCSI controller 35 comprises an internal processor 21, a timer 22, a phase controller 23, a transfer controller 24, and a plurality of buffer registers 25. A control section includes the internal processor 21, timer 22, phase controller 23 and transfer controller 24. The protocol controller 35 includes the buffer registers 25 and the control section. A signal processing unit comprises an MPU (Micro Processor Unit) 34 and a memory unit 36.

A DMA (Direct Memory Access) interface 28 is interposed between the protocol controller 35 and the memory unit 36 coupled to the controller 35. A MPU interface 27 communicatively couples the MPU 34 to the controller 35. The SCSI interface 26 is interposed between the controller 35 and a SCSI bus 29 coupled to the controller 35. Output signals from the SCSI interface 26 are coupled to the SCSI bus 29 via a plurality of the output buffer circuits 30 described in each of the above embodiments.

The protocol controller 35 controls the transfer of signals among peripheral signal processing units such as the MPU 34 and memory unit 36, and any system properly connected to the controller via the SCSI bus 29. These systems act as to execute the signal transfer controlled by the protocol controller 35. The internal processor 21 controls the transfer of signals according to programs incorporated in the controller 35. The timer 22 controls the timing of the transferred signals, for example, according to the period of time required to transfer a specific signal.

The phase controller 23 controls the phases of the signals, while the transfer controller 24 controls the transfer timing of the signals. Signals transferred via the SCSI interface 26 from the protocol controller 35 to another SCSI system are coupled to the SCSI bus 29 via the output buffer circuits 30. The output buffer circuits 30 are used to improve the signal transferring speed to reduce the power consumed by the controller 35.

Figure 26:
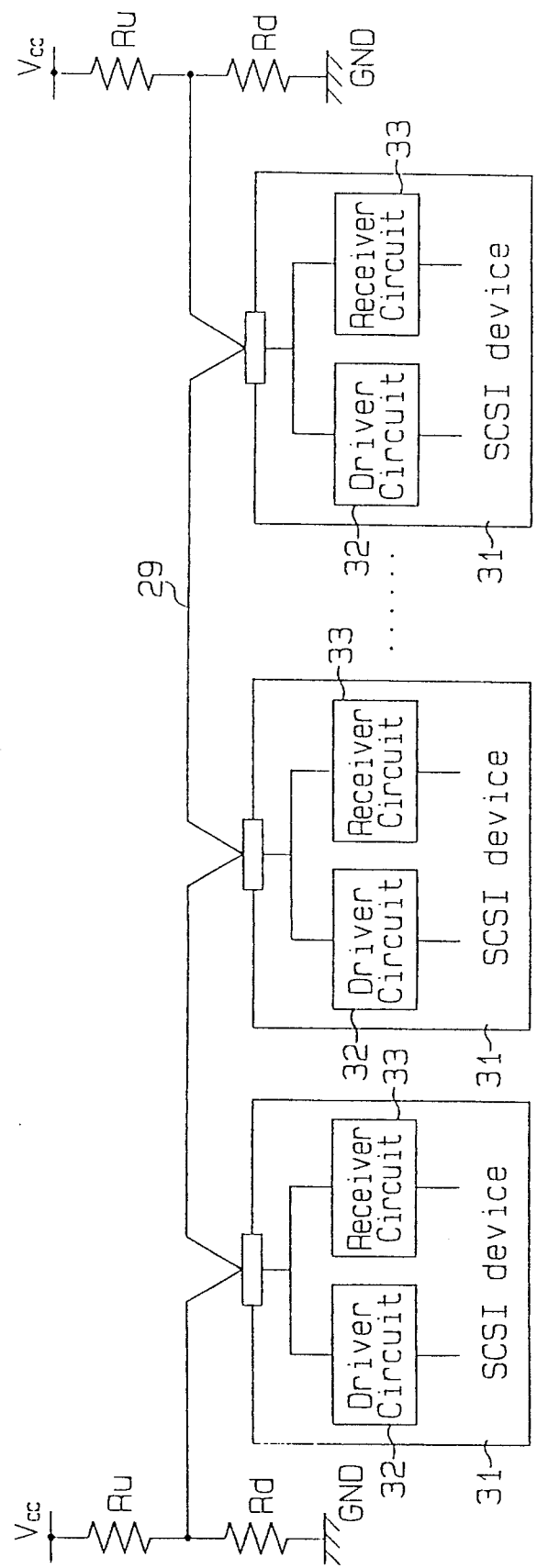
FIG. 26 is illustrative of one example of the SCSI system embodying the protocol controller.

FIG. 26 is illustrative of one example of the SCSI system embodying the protocol controller 35 detailed in FIG. 25. A plurality of SCSI devices 31 are connected to the SCSI bus 29. These SCSI devices 31 comprise peripheral equipments for use of connecting personal computer, printer, hard disc drive or the like to the SCSI bus 29. A driver circuit 32 and a receiver circuit 33, which are incorporated in each SCSI device 31, are incorporated in the protocol controller 35. The incorporation could be made using integrated circuit technology in which circuits 32 and 33 could be constructed as semiconductor integrated circuit components.

The driver circuit 32 includes the output buffer circuit. Terminal resistors Ru and Rd are connected to the SCSI bus 29. According to the above SCSI system, the driver circuit 32 comprising the output buffer circuit can improve the signal transferring speed and can reduce the consumed power.

What is claimed is:

1. An output buffer circuit comprising:
   a pull-down side transistor connected between an output terminal and a low-potential power source, said pull-down side transistor being driven by an input signal in such a manner that when said pull-down side transistor is turned on by said input signal, a low level output signal is output from said output terminal; and
   a pull-up circuit, connected between said output terminal and a high-potential power source, for changing said output signal to a high level in accordance with said input signal when said transistor is turned off in response to said input signal, said pull-up circuit ceasing to function when said output signal goes high, said pull-up circuit comprising
      an OR gate, which receives said input signal and said output signal;
      an inverter, which receives an output signal of said OR gate; and
      a differentiating circuit through which an output signal of said inverter circuit is output to said output terminal.

2. The output buffer circuit according to claim 1, wherein said pull-down side transistor comprises an N channel MOS transistor which is turned on by a high level input signal.

3. An output buffer circuit comprising:
   a pull-down side transistor connected between an output terminal and a low-potential power source, said pull-down side transistor being driven by an input signal in such a manner that when said pull-down side transistor is turned on by said input signal, a low level output signal is output from said output terminal: and
   a pull-up circuit, connected between said output terminal and a high-potential power source, for changing said output signal to a high level in accordance with said input signal when said transistor is turned off in response to said input signal, said pull-up circuit ceasing to function when said output signal goes high, said pull-up circuit including:
   an N channel MOS transistor connected between said output terminal and said high-potential power source;
   an inverter, which receives said output signal output from said output terminal;
   an integrator, which receives an output signal of said inverter; and
   a switch circuit provided between an output terminal of said integrator and a gate of said N channel MOS transistor, said switch circuit being closed in response to said pull-down side transistor turning off.

4. An output buffer circuit comprising:
   a pull-up side transistor connected between a high-potential power source and an output terminal;
   a pull-down side transistor connected between said output terminal and a low-potential power source, said pull-up side and pull-down side transistors both being driven by an input signal, a high level output signal, a low level output signal or a high-impedance output signal being output from said output terminal based on said input signal;
   a pull-up circuit for driving said pull-up side transistor based on said input signal in such a way that when said output signal goes to a high impedance state from a low level, said pull-up circuit supplies a current to said output terminal from said pull-up side transistor until said output signal goes high, said pull-up circuit comprising:
      a delay circuit for outputting said output signal with a delay:
      an inverter which receives said delay output signal of said delay circuit: and
      an N channel MOS transistor connected between said high-potential power source and said pull-up side transistor, and having a gate supplied with an output signal of said inverter.

5. An output buffer circuit comprising:
   a pull-up side transistor connected between a high-potential power source and an output terminal;
   a pull-down side transistor connected between said output terminal and a low-potential power source, said pull-up side and said pull-down side transistors both being driven by an input signal, a high level output signal, a low level output signal or a high-impedance output signal being output from said output terminal based on said input signal;
   a pull-up circuit for driving said pull-up side transistor based on said input signal in such a way that when said output signal goes to a high impedance state from a low level, said pull-up circuit supplies a current to said output terminal from said pull-up side transistor until said output signal goes high, said pull-up circuit comprising:
      an OR gate, which receives the input signal for driving said pull-up side transistor and said output signal;
      an inverter, which receives an output signal of said OR gate; and
      a differentiating circuit through which an output signal of said inverter circuit is output to said output terminal.

6. An output buffer circuit comprising:
   a pull-up side transistor connected between a high-potential power source and an output terminal;
   a pull-down side transistor connected between said output terminal and a low-potential power source, said pull-up side and pull-down side transistors both being driven by an input signal, a high level output signal, a low level output signal or a high-impedance output signal being output from said output terminal based on said input signal;

a pull-up circuit for driving said pull-up side transistor based on said input signal in such a way that when said output signal goes to a high impedance state from a low level, said pull-up circuit supplies a current to said output terminal from said pull-up side transistor until said output signal goes high, said pull-up circuit comprising:

a logic control circuit for outputting a signal to turn on said pull-up side transistor based on said input signal for turning off said pull-down side transistor, and a signal to turn off said pull-up side transistor based on said high level output signal; and a delay circuit for outputting an output signal of said logic control circuit to a gate of said pull-up side transistor with a delay.

7. An output buffer circuit comprising:

a pull-up side transistor connected between a high-potential power source and an output terminal;

a pull-down side transistor connected between said output terminal and a low-potential power source, said pull-up side and pull-down side transistors both being driven by an input signal, a high level output signal, a low level output signal or a high-impedance output signal being output from said output terminal based on said input signal;

a pull-up circuit for driving said pull-up side transistor based on said input signal in such a way that when said output signal goes to a high impedance state from a low level, said pull-up circuit supplies a current to said output terminal from said pull-up side transistor until said output signal goes high, said pull-up circuit comprising:

a switching element provided between said pull-up side transistor and said output terminal;

a logic gate for closing said switching element based on said low level output signal and opening said switching element based on said high level output signal; and a delay circuit for outputting said output signal to said logic gate with a delay.

8. An output buffer circuit comprising:

a pull-up side transistor connected between a high-potential power source and an output terminal;

a pull-down side transistor connected between said output terminal and a low-potential power source, said pull-up side pull-down side transistors both being driven by an input signal, high level output signal, a low level output signal or a high-impedance output signal being output from said output terminal based on said input signal;

a pull-up circuit for driving said pull-up side transistor based on said input signal in such a way that when said output signal goes to a high impedance state from a low level, said pull-up circuit supplies a current to said output terminal from said pull-up side transistor until said output signal goes high, said pull-up circuit comprising:

a logic control circuit for outputting a signal to turn on said pull-up side transistor based on said input signal for turning off said pull-down side transistor, and a signal to turn off said pull-up side transistor in response to said high level output signal; and a delay circuit for outputting said output signal to said logic control circuit with a delay.

9. An output buffer circuit comprising:

a pull-up side transistor connected between a high-potential power source and an output terminal;

a pull-down side transistor connected between said output terminal and a low-potential power source, said pull-up side and pull-down side transistors both being driven by an input signal, a high level output signal, a low level output signal or a high-impedance output signal being output from said output terminal based on said input signal;

a pull-up circuit for driving said pull-up side transistor based on said input signal in such a way that when said output signal goes to a high impedance state from a low level, said pull-up circuit supplies a current to said output terminal from said pull-up side transistor until said output signal goes high, said pull-up circuit comprising:

a logic gate control circuit for connecting said pull-up side transistor to the output terminal based on a delayed output signal; and a delay circuit for outputting said delayed output signal for controlling said logic gate control circuit.

10. A protocol controller, said protocol controller comprising:

a signal processing unit comprising a Micro Processing Unit (MPU) and a memory unit;

a Small Computer System Interface (SCSI) protocol controller comprising a control section and a buffer register;

a bus for transferring signals provided by said SCSI protocol controller;

a first interface interconnected between said SCSI protocol controller and said bus;

a second interface interconnected between said SCSI protocol controller and said signal processing unit;

an output buffer circuit interposed between the first interface and the bus, said output buffer circuit including:

a pull-down side transistor connected between an output terminal and a low-potential power source, said pull-down side transistor being driven by an input signal in such a manner that when said pull-down side transistor is turned on by said input signal, a low level output signal is output from said output terminal; and a pull-up circuit, connected between said output terminal and a high-potential power source, for changing said output signal to a high level in accordance with said input signal such that when said transistor is turned off in response to said input signal, said pull-up circuit ceasing to function when said output signal goes high, said pull-circuit comprising an OR gate, said OR gate receiving said input signal and said output signal, an inverter, which receives an output signal of said OR gate, and a differentiating circuit through which an output signal of said inverter circuit is output to said output terminal.

11. A signal processing system, said signal processing system comprising:

a bus connected to a terminal resistor;

a signal processing unit comprising a Micro Processing Unit (MPU) and a memory unit;

a Small Computer System Interface (SCSI) device interconnected between said bus and said signal processing unit, said SCSI device comprising an output buffer circuit and a receiver circuit, said output buffer circuit comprising:

a pull-down side transistor connected between an output terminal and a low-potential power source, said pull-down side transistor being driven by an input signal in such a manner that when said pull-down side transistor is turned on by said input signal, a low level output signal is output from said output terminal; and a pull-up circuit, connected between said output terminal and a high-potential power source, for changing said output signal to an high level in accordance with said input signal when said transistor is turned off in response to said input signal, said pull-up circuit ceasing to function when said output signal goes high, said pull-circuit comprising an OR gate, said OR gate receiving said input signal and said output signal, an inverter, which receives an output signal of said OR gate, and a differentiating circuit through which an output signal of said inverter circuit is output to said output terminal.

12. A semiconductor integrated circuit, said semiconductor integrated circuit comprising:

an output buffer circuit;

a logic control circuit coupled to said output buffer circuit to control said buffer circuit, said output buffer circuit including:

a pull-down side transistor connected between an output terminal and a low-potential power source, said pull-down side transistor being driven by an input signal in such a manner that when said pull-down side transistor is turned on by said input signal, a low level output signal is output from said output terminal; and a pull-up circuit, connected between said output terminal and a high-potential power source, for changing said output signal to a high level in accordance with said input signal when said transistor is turned off in response to said input signal, said pull-up circuit ceasing to function when said output signal goes high, said pull-circuit comprising an OR gate, said OR gate receiving said input signal and said output signal, an inverter, which receives an output signal of said OR gate, and a differentiating circuit through which an output signal of said inverter circuit is output to said output terminal.

13. A protocol controller comprising:

a signal processing unit comprising a Micro Processing Unit (MPU) and a memory unit;

a Small Computer System Interface (SCSI) protocol controller comprising a control section and a buffer register;

a bus for transferring signals provided by said SCSI protocol controller;

a first interface interconnected between said SCSI protocol controller and said bus;

a second interface interconnected between said SCSI protocol controller and said signal processing unit;

an output buffer circuit interposed between the first interface and the bus, said output buffer circuit including:

a pull-down side transistor connected between an output terminal and a low-potential power source, said pull-down side transistor being driven by an input signal in such a manner that when said pull-down side transistor is turned on by said input signal, a low level output signal is output from said output terminal; and a pull-up circuit, connected between said output terminal and a high-potential power source, for changing said output signal to a high level in accordance with said input signal such that when said transistor is turned off in response to said input signal, said pull-up circuit ceasing to function when said output signal goes high, said pull-up circuit including an N channel MOS transistor connected between said output terminal and said high-potential power source, an inverter, which receives said output signal output from said output terminal, an integrator, which receives an output signal of said inverter, and said pull-up circuit also including a switch circuit provided between an output terminal of said integrator and a gate of said N channel MOS transistor, said switch circuit being closed in response to said pull-down side transistor turning OFF.

14. A signal processing system, said signal processing system comprising:

a bus connected to a terminal resistor;

a signal processing unit comprising a Micro Processing Unit (MPU) and a memory unit;

a Small Computer System Interface (SCSI) device interconnected between said bus and said signal processing unit said SCSI device comprising an output buffer circuit and a receiver circuit, said output buffer circuit comprising:

a pull-down side transistor connected between an output terminal and a low-potential power source, said pull-down side transistor being driven by an input signal in such a manner that when said pull-down side transistor is turned on by said input signal, a low level output signal is output from said output terminal; and a pull-up circuit, connected between said output terminal and a high-potential power source, for changing said output signal to an high level in accordance with said input signal when said transistor is turned off in response to said input signal, said pull-up circuit ceasing to function when said output signal goes high, said pull-up circuit including an N channel MOS transistor connected between said output terminal and said high-potential power source, an inverter, which receives said output signal output from said output terminal, an integrator, which receives an output signal of said inverter, and said pull-up circuit also including a switch circuit provided between an output terminal said integrator and a gate of said N channel MOS transistor, said switch circuit being closed in response to said pull-down side transistor turning OFF.

15. A semiconductor integrated circuit comprising:

an output buffer circuit;

a logic control circuit coupled to said output buffer circuit to control said buffer circuit, said output buffer circuit including:

a pull-down side transistor connected between an output terminal and a low-potential power source, said pull-down side transistor being driven by an input signal in such a manner that when said pull-down side transistor is turned on by said input signal, a low level output signal is output from said output terminal; and a pull-up circuit, connected between said output terminal and a high-potential power source, for changing said output signal to a high level in accordance with said input signal when said transistor is turned off in response to said input signal, said pull-up circuit ceasing to function when said output signal goes high, said pull-up circuit including
an N channel MOS transistor connected between said output terminal and said high-potential power source, an inverter, which receives said output signal output from said output terminal,
an integrator, which receives an output signal of said inverter, and said pull-up circuit also including a switch circuit provided between an output terminal of said integrator and a mate of said N channel MOS transistor, said switch circuit being closed in response to said pull-down side transistor turning OFF.

16. A protocol controller comprising:

a signal processing unit comprising a Micro Processing Unit (MPU) and a memory unit;

a Small Computer System Interface (SCSI) protocol controller comprising a control section and a buffer register;

a bus for transferring signals provided by said SCSI protocol controller;

a first interface interconnected between said SCSI protocol controller and said bus;

a second interface interconnected between said SCSI protocol controller and said signal processing unit;

an output buffer circuit interposed between the first interface and the bus, said output buffer circuit including:
a pull-up side transistor connected between a high-potential power source and an output terminal;
a pull-down side transistor connected between said output terminal and a low-potential power source, said pull-up side and said pull-down side transistors both being driven by an input signal, a high level output signal, a low level output signal, or a high-impedance output signal being output from said output terminal based on said input signal; and
a pull-up circuit for driving said pull-up side transistor based on said input signal such that when said output signal goes to a high impedance state from a low level, said pull-up circuit supplies a current to said output terminal from said pull-up side transistor until said output signal goes high, said pull-up circuit comprising
a delay circuit for outputting said output signal with a delay,
an inverter which receives said delayed output signal of said delay circuit, and said pull-up circuit also comprising an N channel MOS transistor connected between said high-potential power source and said pull-up side transistor,
and having a gate supplied with an output signal of said inverter.

17. A signal processing system comprising:

a bus connected to a terminal resistor;

a signal processing unit comprising a Micro Processing Unit (MPU) and a memory unit;

a Small Computer System Interface (SCSI) device interconnected between said bus and said signal processing unit said SCSI device comprising an output buffer circuit and a receiver circuit, said output buffer circuit comprising:
a pull-up side transistor connected between a high-potential power source and an output terminal;
a pull-down side transistor connected between said output terminal and a low-potential power source, said pull-up side and said pull-down side transistors both being driven by an input signal, a high level output signal, a low level output signal, or a high-impedance output signal being output from said output terminal based on said input signal; and
a pull-up circuit for driving said pull-up side transistor based on said input signal such that when said output signal goes to a high impedance state from a low level, said pull-up circuit supplies a current to said output terminal from said pull-up side transistor until said output signal goes high, said pull-up circuit comprising
a delay circuit for outputting said output signal with delay,
an inverter which receives said delayed output signal of said delay circuit, and said pull-up circuit also comprising an N channel MOS transistor connected between said high-potential power source and said pull-up side transistor, and having a gate supplied with an output signal of said inverter.

18. A semiconductor integrated circuit comprising:

an output buffer circuit;

a logic control circuit coupled to said output buffer circuit to control said buffer circuit, said output buffer circuit including:
a pull-up side transistor connected between a high-potential power source and an output terminal;
a pull-down side transistor connected between said output terminal and a low-potential power source, said pull-up side and said pull-down side transistors both being driven by an input signal, a high level output signal, a low level output signal, or a high-impedance output signal being output from said output terminal based on said input signal; and
a pull-up circuit for driving said pull-up side transistor based on said input signal such that when said output signal goes to a high impedance state from a low level, said pull-up circuit supplies a current to said output terminal from said pull-up side transistor until said output signal goes high, said pull-up circuit comprising
a delay circuit for outputting said output signal with a delay,
an inverter which receives said delayed output signal of said delay circuit, and said pull-up circuit also comprising
an N channel MOS transistor connected between said high-potential power source and said pull-up side transistor, and having a gate supplied with an output signal of said inverter.

19. A protocol controller, said protocol controller comprising:

a signal processing unit comprising a Micro Processing Unit (MPU) and a memory unit;

a Small Computer System Interface (SCSI) protocol controller comprising a control section and a buffer register;

a bus for transferring signals provided by said SCSI protocol controller;

a first interface interconnected between said SCSI protocol controller and said bus;

a second interface interconnected between said SCSI protocol controller and said signal processing unit;

an output buffer circuit interposed between the first interface and the bus, said output buffer circuit including:
a pull-up side transistor connected between a high-potential power source and an output terminal;

a pull-down side transistor connected between said output terminal and a low-potential power source, said pull-up side transistor and said pull-down side transistor both being driven by an input signal, a high level output signal, a low level output signal, or a high-impedance output signal being output from said output terminal based on said input signal; and a pull-up circuit for driving said pull-up side transistor based on said input signal such that when said output signal goes to a high impedance state from a low level, said pull-up circuit supplies a current to said output terminal from said pull-up side transistor until ceasing to function when said output signal goes high, said pull-up circuit comprising an OR gate, which receives the input signal for driving said pull-up side transistor and said output signal;

an inverter, which receives an output signal of said OR gate, and said pull-up circuit also comprising:

a differentiating circuit through which an output signal of said inverter circuit is output to said output terminal.

20. A signal processing system, said signal processing system comprising:

a bus connected to a terminal resistor;

a signal processing unit comprising a Micro Processing Unit (MPU) and a memory unit;

a Small Computer System Interface (SCSI) device interconnected between said bus and said signal processing unit said SCSI device comprising an output buffer circuit and a receiver circuit, said output buffer circuit comprising:

a pull-up side transistor connected between a high-potential power source and an output terminal;

a pull-down side transistor connected between said output terminal and a low-potential power source, said pull-up side transistor and said pull-down side transistor both being driven by an input signal, a high level output signal, a low level output signal, or a high-impedance output signal being output from said output terminal based on said input signal; and a pull-up circuit for driving said pull-up side transistor based on said input signal such that when said output signal goes to a high impedance state from a low level, said pull-up circuit supplies a current to said output terminal from said pull-up side transistor until ceasing to function when said output signal goes high, said pull-up circuit comprising an OR gate, which receives the input signal for driving said pull-up side transistor and said output signal an inverter, which receives an output signal of said OR gate, and said pull-up circuit also comprising:

a differentiating circuit through which an output signal of said inverter circuit is output to said output terminal.

21. A semiconductor integrated circuit, said semiconductor integrated circuit comprising:

an output buffer circuit;

a logic control circuit coupled to said output buffer circuit to control said buffer circuit, said output buffer circuit including:

a pull-up side transistor connected between a high-potential power source and an output terminal;

a pull-down side transistor connected between said output terminal and a low-potential power source, said pull-up side transistor and said pull-down side transistor both being driven by an input signal, a high level output signal, a low level output signal, or a high-impedance output signal being output from said output terminal based on said input signal; and a pull-up circuit for driving said pull-up side transistor based on said input signal such that when said output signal goes to a high impedance state from a low level, said pull-up circuit supplies a current to said output terminal from said pull-up side transistor until ceasing to function when said output signal goes high, said pull up circuit comprising an OR gate, which receives the input signal for driving said pull-up side transistor and said output signal;

an inverter, which receives an output signal of said OR gate, and said pull-up circuit also comprising:

a differentiating circuit through which an output signal of said inverter circuit is output to said output terminal.

22. A protocol controller, said protocol controller comprising:

a signal processing unit comprising a Micro Processing Unit (MPU) and a memory unit;

a Small Computer System Interface (SCSI) protocol controller comprising a control section and a buffer register;

a bus for transferring signals provided by said SCSI protocol controller;

a first interface interconnected between said SCSI protocol controller and said bus;

a second interface interconnected between said SCSI protocol controller and said signal processing unit;

an output buffer circuit interposed between the first interface and the bus, said output buffer circuit including:

a pull-up side transistor connected between a high-potential power source and an output terminal:

a pull-down side transistor connected between said output terminal and a low-potential power source, said pull-up side and said pull-down side transistors both being driven by an input signal, a high level output signal, a low level output signal, or a high-impedance output signal being output from said output terminal based on said input signal; and a pull-up circuit for driving said pull-up side transistor based on said input signal such that when said output signal goes to a high impedance state from a low level, said pull-up circuit supplies a current to said output terminal from said pull-up side transistor until ceasing to function when said output signal goes high, said pull-up circuit comprising a switching element provided between said pull-up side transistor and said output terminal, a logic gate for closing said switching element based on said low level output signal and opening said switching element based on said high level output signal, said pull-up circuit also comprising a delay circuit for outputting said output signal to said logic gate with a delay.

23. A signal processing system, said signal processing system comprising:

a bus connected to a terminal resistor;

a signal processing unit comprising a Micro Processing Unit (MPU) and a memory unit;

a Small Computer System Interface (SCSI) device interconnected between said bus and said signal processing unit, said SCSI device comprising an output buffer circuit and a receiver circuit, said output buffer circuit comprising:

a pull-up side transistor connected between a high-potential power source and an output terminal;

a pull-down side transistor connected between said output terminal and a low-potential power source, said pull-up side and said pull-down side transistors both being driven by an input signal, a high level output signal, a low level output signal, or a high-impedance output signal being output from said output terminal based on said input signal; and a pull-up circuit for driving said pull-up side transistor based on said input signal such that when said output signal goes to a high impedance state from a low level, said pull-up circuit supplies a current to said output terminal from said pull-up side transistor until ceasing to function when said output signal goes high, said pull-up circuit comprising a switching element provided between said pull-up side transistor and said output terminal, a logic gate for closing said switching element based on said low level output signal and opening said switching element based on said high level output signal, said pull-up circuit also comprising a delay circuit for outputting said output signal to said logic gate with a delay.

24. A semiconductor integrated circuit, said semiconductor integrated circuit comprising:

an output buffer circuit;

a logic control circuit coupled to said output buffer circuit to control said buffer circuit, said output buffer circuit including:

a pull-up side transistor connected between a high-potential power source and an output terminal:

a pull-down side transistor connected between said output terminal and a low-potential power source, said pull-up side and said pull-down side transistors both being driven by an input signal, a high level output signal, a low level output signal, or a high-impedance output signal being output from said output terminal based on said input signal; and a pull-up circuit for driving said pull-up side transistor based on said input signal such that when said output signal goes to a high impedance state from a low level, said pull-up circuit supplies a current to said output terminal from said pull-up side transistor until ceasing to function when said output signal goes high, said pull-up circuit comprising a switching element provided between said pull-up side transistor and said output terminal, a logic gate for closing said switching element based on said low level output signal and opening said switching element based on said high level output signal, and said pull-up circuit also comprising a delay circuit for outputting said output signal to said logic gate with a delay.

* * * * *